United States Patent [19]
Oguni et al.

[11] Patent Number: 5,866,294
[45] Date of Patent: Feb. 2, 1999

[54] WATER-LESS QUINONEDIAZIDE LITHOGRAPHIC RAW PLATE

[75] Inventors: Masahiro Oguni; Kazuki Goto; Mitsuru Suezawa; Shun-ichi Yanagida; Norimasa Ikeda, all of Shiga, Japan

[73] Assignee: Toray Industries, Inc., Japan

[21] Appl. No.: 847,938

[22] Filed: Apr. 28, 1997

Related U.S. Application Data

[63] Continuation of Ser. No. 448,532, filed as PCT/JP94/01798, Oct. 26, 1994 published as WO95/12146, May 4, 1995, abandoned.

[30] Foreign Application Priority Data

| Oct. 26, 1993 | [JP] | Japan | 5-267026 |
| Oct. 26, 1993 | [JP] | Japan | 5-267027 |
| Oct. 26, 1993 | [JP] | Japan | 5-267028 |
| Jul. 7, 1994 | [JP] | Japan | 6-156206 |

[51] Int. Cl.$^6$ ..................................... G03F 7/23
[52] U.S. Cl. .................. 430/166; 430/272.1; 430/273.1; 430/303
[58] Field of Search .................. 430/162, 166, 430/272.1, 273.1, 303

[56] References Cited

U.S. PATENT DOCUMENTS 4,156,389  5/1979  Sano et al. .

FOREIGN PATENT DOCUMENTS

| 069 978 A2 | 1/1983 | European Pat. Off. . |
| 0 100 938 A3 | 2/1984 | European Pat. Off. . |
| 0 154 980 A1 | 9/1985 | European Pat. Off. . |
| 0 242 143 A2 | 10/1987 | European Pat. Off. . |
| 63-213849 | 9/1988 | Japan . |
| 2-4253 | 1/1990 | Japan . |
| 4-97360 | 3/1992 | Japan . |
| 4338954 | 11/1992 | Japan . |

*Primary Examiner*—Christopher G. Young
*Attorney, Agent, or Firm*—Austin R. Miller

[57] ABSTRACT

The present invention is a water-less lithographic printing plate, in which a photosensitive layer and a silicone rubber layer are laminated in this order on a substrate, characterized in that the photosensitive layer contains the reaction product between a compound with at least one each of phenolic hydroxyl groups and non-phenolic hydroxyl groups and a quinonediazide compound, or contains both the reaction product between a compound with at least one of phenolic hydroxyl groups and a quinonediazide compound, and the reaction product between a compound with at least one of non-phenolic hydroxyl groups and a quinonediazide compound.

The water-less lithographic raw plate of the present invention is excellent in image reproducibility and printing durability, and so can be favorably and economically advantageously used also in the commercial web offset printing and the newspaper web offset printing where high printing durability is required.

17 Claims, No Drawings

WATER-LESS QUINONEDIAZIDE LITHOGRAPHIC RAW PLATE

This application is a continuation of application Ser. No. 08/448,532, filed as PCT/JP94/01798, Oct. 26, 1994, published as WO95/12146, May 4, 1995, now abandoned.

TECHNICAL FIELD

The present invention relates to a water-less lithographic raw plate, and a water-less lithographic printing plate obtained by selectively exposing and developing the water-less lithographic raw plate, in more detail, a water-less lithographic raw plate remarkably improved in printing durability, and a water-less lithographic printing plate obtained by selectively exposing and developing the water-less lithographic raw plate.

BACKGROUND OF THE INVENTION

Various printing plates for lithography using a silicone rubber or fluorine resin as the ink repellent layer without using any dampening water, especially selectively exposed and developed photosensitive lithographic printing plates have been being proposed.

For example, as positive type photosensitive lithographic printing plates, Japanese Patent Publication (Koho) SHO 54-26923 and 56-23150, etc. propose water-less lithographic printing plates with a photo polymerizable adhesive layer and a silicone rubber layer as an ink repellent layer laminated on a substrate, and Japanese Patent Publication (Koho) HEI 3-56622, Japanese Patent Laid-Open (Kokai) SHO 61-153655, etc. propose water-less lithographic printing plates with a photo-dimerized photosensitive layer and a silicone rubber layer as an ink repellent layer laminated on a substrate.

Furthermore, as negative type photosensitive lithographic printing plates, Japanese Patent Publication (Koho) SHO 61-616 and 61-54218, etc. propose water-less lithographic printing plates with a photosensitive layer containing a quinonediazide compound formed on a substrate and with a silicone rubber layer as an ink repellent layer formed on the photosensitive layer through an adhesive layer, and Japanese Patent Publication (Koho) SHO 61-54222, etc. propose water-less printing plates with a silicone rubber layer as an ink repellent layer formed on a photo releasable photosensitive layer. These printing plates are known to have practically excellent performance. Among them, especially Japanese Patent Publication (Koho) SHO 61-54222 proposes a negative type water-less lithographic printing plate, in which a photo releasable photosensitive layer obtained by crosslinking a partially esterified product of 1,2-naphthoquinone-2-diazido-5-sulfonic acid chloride and a phenol novolak resin by a polyfunctional isocyanate is formed on a substrate, with a silicone rubber layer as an ink repellent layer formed on the photosensitive layer.

Moreover, as photosensitive lithographic printing plates using a fluorine resin as the ink repellent layer, Japanese Patent Laid-Open (Kokai) HEI 2-254449 and 2-85855, etc. disclose water-less lithographic printing plates with a fluorine resin obtained by using 1H,1H,2H,2H-heptadecafluorodecyl acrylate or 1H,1H,2H,2H-heptadecafluorodecyl methacrylate as the ink repellent layer.

However, these photosensitive lithographic printing plates are relatively hard and fragile in the photosensitive layer, and are liable to be damaged by the stress acting on the plate surface during offset printing. According to the increase in the number of printed sheets, the photosensitive layer is damaged in the non-image area under the ink repellent layer, and the damage expands into the ink repellent layer, to lower image reproducibility disadvantageously. This appears as a problem of low printing durability of the printing plate.

To improve the printing durability, various studies have been conducted. Japanese Patent Laid-Open (Kokai) HEI 5-53306 and 5-53307, etc. propose water-less lithographic printing plates with a soft primer layer containing a natural protein and an urethane elastomer, or a polyurethane and a silane coupling agent, between the substrate and the photosensitive layer. In either case, no practically sufficient printing durability can be obtained, and since the primer layer is required to be thick enough to ensure the physical properties required for the photosensitive layer, the primer layer may be insufficiently cured to cause the peeling of the ink repellent layer and the peeling of the photosensitive layer, and furthermore in a worse case, the peeling of the primer layer itself from the substrate.

There have been attempts to increase the thickness of the ink repellent layer, but they lower the developability and lessen the ink mileage disadvantageously.

Japanese Patent Laid-Open (Kokai) HEI 1-154158 and 1-154159, etc. adopt a thicker silicone rubber layer as the ink repellent layer, and an ink retaining material is embedded for adjustment of cell depth to compensate for the decrease of the ink mileage caused by the thickening. However there remains the problem of lower developability, and adding a new step of embedding an ink retaining material, etc. is practically inconvenient. Japanese Patent Laid-Open (Kokai) HEI 1-161242 proposes a water-less lithographic printing plate prepared by exposing a plate with an ink retaining layer (photosensitive layer) at the top to an image, developing, coating it with an ink repellent layer (silicone rubber layer), and developing again. However, the plate obtained by this technique is poor in the ink retainability of the image area, and unpractically requires many steps such as the application of the silicone rubber layer after development of the photosensitive layer and twice development per plate.

The improvement of the physical properties of the silicone rubber layer as the ink repellent layer is also studied. The addition of a filler and the increase of the molecular weight of polydimethylsiloxane are proposed. Furthermore, Japanese Patent Laid-Open (Kokai) HEI 2-32349 proposes a water-less lithographic printing plate with a microporous layer containing a hardened ink repellent material, and Japanese Laid-Open (Kokai) HEI 2-8847, a water-less lithographic printing plate with a silicone rubber layer containing a graft polymer with a polyorganosiloxane as grafts. However, though these techniques can improve the flaw resistance, they cannot improve the printing durability sufficiently. On the contrary, there is a problem that they lower the ink repellency which should be kept by the silicone rubber layer.

Japanese Patent Laid-Open (Kokai) SHO 63-213848 proposes a photosensitive layer containing an acrylic acid derivative copolymer, but the proposal has problems that if the amount of the acrylic acid derivative copolymer contained in the photosensitive layer is 50 wt % or more, the image reproducibility and the adhesiveness to the silicone rubber layer as the ink repellent layer are impaired, and that if 50 wt % or less, the printing durability is insufficient.

Japanese Patent Laid-Open (Kokai) HEI 3-20741 proposes to let the photosensitive layer contain a high polymer with a vinyl carboxylate as a component, and Japanese Patent Laid-Open (Kokai) HEI 3-68946, to let the photosensitive layer contain a hydroxyphenylmethacrylamide derivative copolymer. Both the proposals state that plates which allow development by an aqueous developing solution and are excellent in printing durability can be obtained. However, these plates have a problem that since they are insufficient in resistance against the solvents of plate cleaner, UV ink, etc., the image areas are destroyed during printing, while the photosensitive layers are eroded by solvents in their non-image areas, to lower the printing durability.

The present invention has been devised to improve the disadvantages of these conventional techniques, and presents a water-less lithographic raw plate greatly improved in printing durability without being lowered in plate developability, image reproducibility, printing characteristics, solvent resistance, etc. by letting the photosensitive layer contain a compound with a specific structure, to soften the photosensitive layer, and by specifying the flexibility of the photosensitive layer and/or the primer layer in reference to the tensile properties such as initial elastic modulus, 10% stress and rupture elongation.

DISCLOSURE OF THE INVENTION

The water-less lithographic raw plate presented in the present invention is excellent in image reproducibility and printing durability. Therefore, it can be favorably used in the newspaper web offset printing area and the commercial web offset printing area where high printing durability is required. The printing plate is also long in life economically advantageously.

The Most Preferred Embodiments of the Invention

The present invention is composed as follows:

(1) A water-less lithographic raw plate, in which at least a photosensitive layer containing a quinonediazide compound and an ink repellent layer are formed in this order on a substrate, comprising:
  said photosensitive layer having the following physical property:
    <1> initial elastic modulus: 5–50 $kgf/mm^2$ as a tensile property.

(2) A water-less lithographic raw plate of (1), wherein the photosensitive layer has the following physical property:
  <2> 10% stress: 0.05–3.0 $kgf/mm^2$ as a tensile property.

(3) A water-less lithographic raw plate of (1), wherein the photosensitive layer has the following physical property:
  <3> rupture elongation: 10% or more as a tensile property.

(4) A water-less lithographic raw plate, in which at least a primer, a photosensitive layer containing a quinonediazide compound and an ink repellent layer are formed in this order on a substrate, comprising:
  said primer layer having the following physical property:
    <1> initial elastic modulus: 5–50 $kgf/mm^2$ as a tensile property.

(5) A water-less lithographic raw plate of (4), wherein the primer layer has the following physical property:
  <2> 10% stress: 0.05–3.0 $kgf/mm^2$ as a tensile property.

(6) A water-less lithographic raw plate of (4), wherein the primer layer has the following physical property:
  <3> rupture elongation: 10% or more as a tensile property.

(7) A water-less lithographic raw plate, in which at least a primer layer, a photosensitive layer containing a quinonediazide compound and an ink repellent layer are formed in this order on a substrate, comprising;
  a sheet consisting of said primer layer and said photosensitive layer having the following physical property:
    <1> initial elastic modulus: 5–50 $kgf/mm^2$ as a tensile property.

(8) A water-less lithographic raw plate of (7), wherein a sheet consisting of said primer layer and said photosensitive layer has the following physical property:
  <2> 10% stress: 0.05–3.0 $kgf/mm^2$ as a tensile property.

(9) A water-less lithographic raw plate of (7), wherein a sheet consisting of said primer layer and said photosensitive layer has the following physical property:
  <3> rupture elongation: 10% or more as a tensile property.

(10) A water-less lithographic raw plate, in which at least a photosensitive layer containing a quinonediazide compound and an ink repellent layer are formed in this order on a substrate, comprising:
  said photosensitive layer having the following physical property after completion of exposure:
    <1> initial elastic modulus: 5–50 $kgf/mm^2$ as a tensile property.

(11) A water-less lithographic raw plate of (10), wherein the photosensitive layer has the following physical property after completion of exposure:
  <2> 10% stress: 0.05–3.0 $kgf/mm^2$ as a tensile property.

(12) A water-less lithographic raw plate of (10), wherein the photosensitive layer has the following physical property after completion of exposure:
  <3> rupture elongation: 10% or more as a tensile property.

(13) A water-less lithographic raw plate, in which at least a primer, a photosensitive layer containing a quinonediazide compound and an ink repellent layer are formed in this order on a substrate, comprising:
  a sheet consisting of said primer layer and said photosensitive layer having the following physical property after completion of exposure:
    <1> initial elastic modulus: 5–50 $kgf/mm^2$ as a tensile property.

(14) A water-less lithographic raw plate of (13), wherein a sheet consisting of said primer layer and said photosensitive layer has the following physical property after completion of exposure:
  <2> 10% stress: 0.05–3.0 $kgf/mm^2$ as a tensile property.

(15) A water-less lithographic raw plate of (13), wherein a sheet consisting of said primer layer and said photosensitive layer has the following physical property after completion of exposure:
  <3> rupture elongation: 10% or more as a tensile property.

(16) A water-less lithographic raw plate, in which at least a photosensitive layer containing a quinonediazide compound and an ink repellent layer are formed in this order on a substrate, comprising:
  the quinonediazide compound in the photosensitive layer being the reaction product between a compound with at least one each of the structures represented by the following general formula (I) and the structures represented by the following general formula (II), and a quinonediazide compound:

  (I)

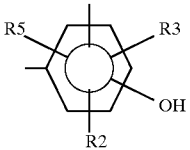  (II)

(where R1 stands for at least one selected from a group consisting of sulfur atom, substituted or non-substituted nitrogen atom, substituted or non-substituted carbon atom and substituted or non-substituted silicon atom; and R2, R3, R4 and R5 stand for, respectively independently, a substituent group).

(17) A water-less lithographic raw plate, in which at least a photosensitive layer containing a quinonediazide compound and an ink repellent layer are formed in this order on a substrate, comprising:

at least one each of both of the following:

(A) Reaction products between compounds with at least one of the structures represented by the following general formula (I) and quinonediazide compounds (B) Reaction products between compounds with at least one of the structures represented by the following general formula (II) and quinonediazide compounds as said quinonediazide compound in the photosensitive layer.

$$-R1-OH \quad (I)$$

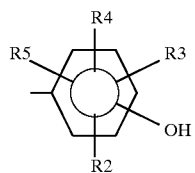

(II)

(where R1 stands for at least one selected from a group consisting of sulfur atom, substituted or non-substituted nitrogen atom, substituted or non-substituted carbon atom and substituted or non-substituted silicon atom; and R2, R3, R4 and R5 stand for, respectively independently, a substituent group).

(18) A water-less lithographic raw plate, in which at least a photosensitive layer containing a quinonediazide compound and an ink repellent layer are formed in this order on a substrate, comprising:

at least one each of both of the following:

(A) Reaction products between a compound with at least two of the structures represented by the following general formula (I) and a quinonediazide compound (B) Reaction products between a compound with at least two of the structures represented by the following general formula (II) and a quinonediazide compound as said quinonediazide compound in the photosensitive layer.

$$-R1-OH \quad (I)$$

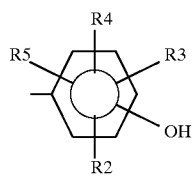

(II)

(where R1 stands for at least one selected from a group consisting of sulfur atom, substituted or non-substituted nitrogen atom, substituted or non-substituted carbon atom and substituted or non-substituted silicon atom; and R2, R3, R4 and R5 stand for, respectively independently, a substituent group).

(19) A water-less lithographic raw plate, in which at least a photosensitive layer containing a quinonediazide compound and an ink repellent layer are formed in this order on a substrate, comprising:

the reaction product obtained by partially crosslinking, by a crosslinking agent, a compound with at least one each of the structures represented by the following general formula (I) and the structures represented by the following general formula (II), and esterifying the partially crosslinked-product by a quinonediazide compound as said quinonediazide compound in the photosensitive layer.

$$-R1-OH \quad (I)$$

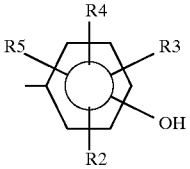

(II)

(where R1 stands for at least one selected from a group consisting of sulfur atom, substituted or non-substituted nitrogen atom, substituted or non-substituted carbon atom and substituted or non-substituted silicon atom; and R2, R3, R4 and R5 stand for, respectively independently, a substituent group).

(20) A water-less lithographic raw plate, in which at least a photosensitive layer containing a quinonediazide compound and an ink repellent layer are formed in this order on a substrate, comprising:

at least one each of the both of the following:

(A) Reaction products obtained by partially crosslinking a compound with at least one of the structures represented by the following formula (I) by a crosslinking agent, and esterifying the crosslinked product by a quinonediazide compound (B) Reaction products obtained by partially crosslinking a compound with at least one of the structures represented by the following formula (II) by a crosslinking agent, and esterifying the crosslinked product by a quinonediazide compound as said quinonediazide compound in the photosensitive layer.

$$-R1-OH \quad (I)$$

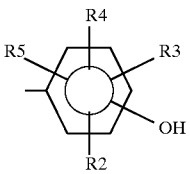

(II)

(where R1 stands for at least one selected from a group consisting of sulfur atom, substituted or non-substituted nitrogen atom, substituted or non-substituted carbon atom and substituted or non-substituted silicon atom; and R2, R3, R4 and R5 stand for, respectively independently, a substituent group).

(21) A water-less lithographic raw plate, in which at least a photosensitive layer containing a quinonediazide compound and an ink repellent layer are formed in this order on a substrate, comprising:

at least one each of both of the following:

(A) Reaction products obtained by partially crosslinking a compound with at least two of the structures represented by the following formula (I) by a crosslinking agent, and esterifying the crosslinked product by a quinonediazide compound (B) Reaction products obtained by partially crosslinking a compound with at least two of the structures represented by the following formula (II) by a crosslinking agent, and esterifying the crosslinked product by a quinonediazide compound as said quinonediazide compound in the photosensitive layer.

—R1—OH     (I)

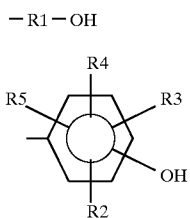

(where R1 stands for at least one selected from a group consisting of sulfur atom, substituted or non-substituted nitrogen atom, substituted or non-substituted carbon atom and substituted or non-substituted silicon atom; and R2, R3, R4 and R5 stand for, respectively independently, a substituent group).

(22) A water-less lithographic raw plate of any one of (19) through (21) wherein the crosslinking agent used for the partial crosslinking of the photosensitive layer is a polyfunctional isocyanate compound.

(23) A water-less lithographic raw plate of any one of (16) through (19), wherein 20% or more of the skeleton of the compound with at least one each of the structures represented by the general formula (I) and the structures represented by the general formula (II) in the photosensitive layer is formed by any other than aromatic ring.

(24) A water-less lithographic raw plate of any one of (17), (18), (20) and (21), wherein 10% or more of the skeleton of the compound with at least one of the structures represented by the general formula (I) in the photosensitive layer is formed by any other than aromatic ring.

(25) A water-less lithographic raw plate of any one of (16) through (21), wherein the esterification degree of the reaction product obtained by esterifying by a quinonediazide compound used in the photosensitive layer is 5 to 95%.

(26) A water-less lithographic raw plate of any one of (16) through (21), wherein the quinonediazido group in the reaction product obtained by esterifying by a quinonediazide compound used in the photosensitive layer is at least one of the structures represented by the following general formulae (III), (IV) and (V):

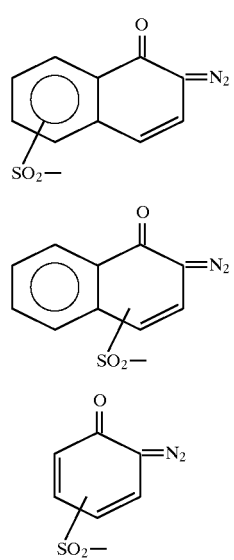

(27) A water-less lithographic raw plate of any one of (1) through (26), wherein the photosensitive layer contains at least one of the compounds represented by the following general formulae (VI), (VII) and (VIII) as a photo-sensitizer.

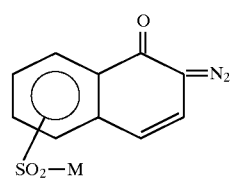

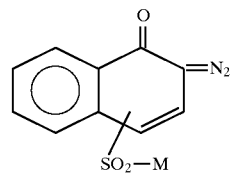

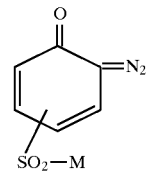

(where M stands for at least one selected from a group consisting of hydroxyl group, alkali metal oxide groups, halogen atoms, amino group, mercapto group, substituted or non-substituted alkyl groups, alkoxy groups, amido groups, acyloxy groups, alkanoyl groups, formyl groups, carboxyl groups with 1 to 100 carbon atoms, substituted or non-substituted alkenyl groups alkenyloxy groups with 2 to 100 carbon atoms, substituted or non-substituted aryl groups, aryloxy groups with 4 to 100 carbon atoms).

(28) A water-less lithographic raw plate of any one of (1) through (27), wherein the photosensitive layer contains a binder polymer.

(29) A water-less lithographic raw plate of (28), wherein the binder polymer accounts for 10 to 90 wt % of the photosensitive layer.

(30) A water-less lithographic raw plate of (28), wherein the glass transition point (Tg) of the binder polymer is 20° C. or lower.

(31) A water-less lithographic raw plate of any one of (1) through (30), wherein the photosensitive layer has a crosslinked structure.

(32) A water-less lithographic raw plate of any one of (1) through (31), wherein the photosensitive layer is a photo-releasable photosensitive layer.

(33) A water-less lithographic raw plate of any one of (1) through (32), wherein the ink repellent layer is a silicone rubber layer.

(34) A water-less lithographic raw plate of any one of (1) through (33), wherein a protective layer is formed on the surface of the ink repellent layer.

(35) A water-less lithographic raw plate of (34), wherein the protective layer is a protective film treated to be plain or rough on the surface.

(36) A water-less lithographic raw plate of any one of (1) through (35), wherein the substrate is a metallic plate made plain or rough on the surface.

(37) A water-less lithographic printing plate, obtained by selectively exposing and developing the water-less lithographic raw plate of any one of (1) through (36).

The constitution of the present invention is described below more concretely.

The water-less lithographic raw plate of the present invention should preferably have such physical properties that the photosensitive layer, or the primer layer, if provided, or a sheet consisting of the photosensitive layer and the primer layer has the following tensile properties before exposure and after completion of exposure:

(1) Initial elastic modulus: 5–50 kgf/mm$^2$
(2) 10% stress: 0.05–3.0 kgf/mm$^2$
(3) Rupture elongation: 10% or more As for the tensile properties of the photosensitive layer or the primer layer or a sheet consisting of both the layers, the initial elastic modulus should be 5 to 50 kgf/mm$^2$, preferably 7 to 45 kgf/mm$^2$, more preferably 10 to 40 kgf/mm$^2$.

The 10% stress should be 0.05 to 3.0 kgf/mm$^2$, more preferably 0.1 to 2.0 kgf/mm$^2$, further more preferably 0.1 to 1.5 kgf/mm$^2$.

If the initial elastic modulus is less than 5 kgf/mm$^2$ and/or the 10% stress value is less than 0.05 kgf/mm$^2$, the photosensitive layer becomes sticky, to cause hickeys during printing.

Furthermore, as for the tensile properties of the photosensitive layer or the primer layer or a sheet consisting of both the layers after completion of exposure, it is important to design to achieve a rupture elongation of 10% or more, preferably 15% or more. If the rupture elongation is less than 10%, the layer concerned is fragile, and will be destroyed during offset printing, not providing high printing durability.

If the photosensitive layer is 50 kgf/mm$^2$ or more in initial elastic modulus and 10% or less in rupture elongation, for example, as hard as 56 kgf/mm$^2$ in tensile initial elastic modulus and 5.0% in rupture elongation as stated in Example 1 of Japanese Patent Publication (Koho) SHO 61-54222, offset printing causes repeated stress to act between the photosensitive layer and the ink repellent layer, to rupture the photosensitive layer itself and subsequently to cause rupture at the bonding interface between the photosensitive layer and the ink repellent layer, not providing high printing durability.

The tensile properties of the photosensitive layer can be measured according to JIS K 6301.

For the tensile properties before exposure, a glass sheet is coated with a sensitizing solution, and after the solvent is volatilized, the coated film is heated to be hardened. The hardened sheet is removed from the glass sheet, as an about 100-micron thick photosensitive sheet. From the sheet, 5 mm×40 mm strip samples are taken by cutting, and tested using Tensilon RTM-100 (produced by Orienteck K.K.) at a tensile speed of 20 cm/min, to measure the initial elastic modulus, 10% stress and rupture elongation.

For the tensile properties after completion of exposure, a glass sheet is coated with a sensitizing solution, and after the solvent is volatilized, the coated sheet is heated to be hardened. Then, it is exposed using a 3 kW extra-high pressure mercury lamp (produced by Oak Seisakusho) for 10 minutes at an illuminance of 12 mW/cm$^2$ identified by a UV meter (Light Measure Type UV365 produced by Oak Seisakusho). Subsequently, the coated sheet of about 100 microns in thickness is removed from the glass sheet. From the sheet, 5 mm×40 mm strip samples are taken by cutting, and tested using Tensilon RTM-100 (produced by Orienteck K.K.) at a tensile speed of 20 cm/min, to measure the initial elastic modulus, 10% stress and rupture elongation.

To measure the tensile properties of a water-less lithographic raw plate after completion of exposure, the plate is exposed for 10 minutes using a metal halide lamp (Idolfin 2000 produced by Iwasaki Electric Co., Ltd.) at an illuminance of 11 mW/cm$^2$ identified by a UV meter (Light Measure Type UV-402A produced by Oak Seisakusho). After completion of exposure, the cover film, if any, is removed, and the plate is coated using a brush with a treating solution consisting of "Isopar H", diethylene glycol dimethyl ether, ethyl cellosolve and N-methyldiethanolamine (=87:7:3:3 as ratio by weight) at room temperature (32° C.) at a humidity of 80%. After treatment for 1 minute, the treating solution deposited on the plate is removed by a rubber squeegee, and a developing solution consisting of water, butylcarbitol and 2-ethylacetic acid (=70:30:2 as ratio by weight) is poured over the plate surface and a developing pad. The plate surface is lightly rubbed by the developing pad, to remove the silicone rubber layer, for exposing the surface of the photosensitive layer. The substrate on the back of the plate treated like this is removed by any proper method, to obtain the photosensitive layer or a sheet consisting of the primer layer and the photosensitive layer. If the substrate is a metallic sheet, it can be removed by a grinder for metals, and if the substrate is a plastic film or sheet, it can be removed by a grinder for plastics, for example. As the case may be, the photosensitive layer only or the sheet consisting of the primer layer and the photosensitive layer may also be removed using a proper solvent. If the substrate is resilient or paper, it can be removed by using any proper solvent or by any physical method similar to the above. Thus, the exposed photosensitive layer only or sheet consisting of the primer layer and the photosensitive layer can be obtained. The layer or sheet obtained like this is used for measuring the initial elastic modulus, 10% stress and rupture elongation according to the above mentioned method.

The photosensitive layer with such tensile properties can be obtained, for example, using the following composition.

That is, a compound with at least one each of the structures represented by the following general formula (I) and the structure represented by the following general formula (II) is used, and the quinonediazido group-containing photosensitive compound obtained by the reaction between said compound and a quinonediazide compound is used as a photosensitive ingredient in the photosensitive layer. Or a compound with at least one of the structures represented by the following general formula (I) and a compound with at least one of the structures represented by the following general formula (II) are used, and a mixture consisting of the quinonediazido group-containing photosensitive compounds obtained by the reactions between these compounds and a quinonediazide compound is used as a photosensitive ingredient in the photosensitive layer. In the latter case, it is recommended that a compound with at least two of the structures represented by the following general formula (I) and a compound with at least two of the structures represented by the following general formula (II) are used and that a mixture consisting of the quinonediazido group-containing photosensitive compounds obtained by the reactions between these compounds and a quinonediazide compound is used as a photosensitive ingredient in the photosensitive layer.

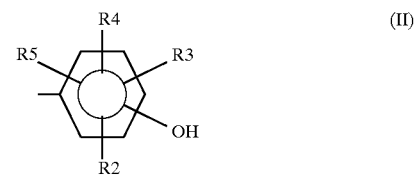

(where R1 stands for at least one selected from a group consisting of sulfur atom, substituted or non-substituted nitrogen atom, substituted or non-substituted carbon atom, and substituted or non-substituted silicon atom; and R2, R3, R4 and R5 stand for, respectively independently, a substituent group).

The substituent group for R1 in the general formula (I) can be, for example, at least one selected from a group consisting of hydroxyl group, alkali metal oxide groups, halogen atoms, amino group, mercapto group, substituted or non-substituted alkyl groups, alkoxy groups, amido groups, acyloxy groups, alkanoyl groups, formyl groups, carboxyl groups with 1 to 100 carbon atoms, substituted or non-substituted alkenyl groups alkenyloxy groups with 2 to 100 carbon atoms, substituted or non-substituted aryl groups, aryloxy groups with 4 to 100 carbon atoms.

Furthermore, R2, R3, R4 and R5 in the general formula (II) stand for, respectively independently at least one selected from, though not limited to, a group consisting of hydrogen atom, halogen atoms, hydroxyl group, nitro group, amino group, mercapto group, cyano group, sulfonyl group, nitroso group, substituted or non-substituted alkyl groups, alkoxy groups, amido groups, acyloxy groups, alkanoyl groups, formyl groups, carboxyl groups with 1 to 100 carbon atoms, substituted or non-substituted alkenyl groups, alkenyloxy groups with 2 to 100 carbon atoms, substituted or non-substituted aryl groups, and aryloxy groups with 4 to 100 carbon atoms.

The compound with at least one each of the structures represented by the general formula (I) and the structures represented by the general formula (II) can be selected from, though not limited to, the compounds enumerated below under (1) through (4).

(1) Compounds with a skeleton obtained by the reaction between an epoxy compound and a phenolbenzoic acid, as represented by the following general formula (IX), which include, for example, though not limited to, the reaction product between 1,2-epoxypropane and 2-hydroxybenzoic acid, the reaction product between 1,2-epoxypropane and 3-hydroxybenzoic acid, the reaction product between 1,2-epoxypropane and 4-hydroxybenzoic acid, the reaction product between 1,2-epoxybutane and 2-hydroxybenzoic acid, the reaction product between 1,2-epoxybutane and 3-hydroxybenzoic acid, the reaction product between 1,2-epoxybutane and 4-hydroxybenzoic acid, the reaction product between 2,3-epoxybutane and 2-hydroxybenzoic acid, the reaction product between 2,3-epoxybutane and 3-hydroxybenzoic acid, the reaction product between 2,3-epoxybutane and 4-hydroxybenzoic acid, the reaction product between 1,2-epoxyhexane and 2-hydroxybenzoic acid, the reaction product between 1,2-epoxyhexane and 3-hydroxybenzoic acid, the reaction product between 1,2-epoxyhexane and 4-hydroxybenzoic acid, the reaction product between 1,2,3,4-diepoxybutane and 2-hydroxybenzoic acid, the reaction product between 1,2,3,4-diepoxybutane and 3-hydroxybenzoic acid, the reaction product between 1,2,3,4-diepoxybutane and 4-hydroxybenzoic acid, the reaction product between glycidyl acrylate and 2-hydroxybenzoic acid, and its homopolymer and copolymers, the reaction product between glycidyl acrylate and 3-hydroxybenzoic acid, its homopolymer and copolymers, the reaction product between glycidyl acrylate and 4-hydroxybenzoic acid, its homopolymer and copolymers, the reaction product between glycidyl methacrylate and 2-hydroxybenzoic acid, its homopolymer and copolymers, the reaction product between glycidyl methacrylate and 3-hydroxybenzoic acid, its homopolymer and copolymers, the reaction product between glycidyl methacrylate and 4-hydroxybenzoic acid, its homopolymer and copolymers, etc. Any other reaction product between a compound with an epoxy group and a phenolbenzoic acid can be used. The molecular weight of the compound with an epoxy group is not especially limited, but should be preferably 60 to 10,000,000, more preferably 80 to 1,000,000.

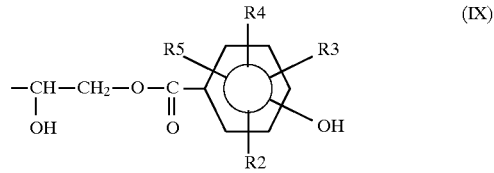

(where R2, R3, R4 and R5 are the same as the R2, R3, R4 and R5 of the general formula (II)).

(2) Compounds with a skeleton obtained by the reaction between a triol or polyol and a hydroxybenzaldehyde, as represented by the following general formula (X), which include, for example, though not limited to, the reaction product between 1,2,4-butanetriol and 2-hydroxybenzaldehyde, the reaction product between 1,2,4-butanetriol and 3-hydroxybenzaldehyde, the reaction product between 1,2,4-butanetriol and 4-hydroxybenzaldehyde, the reaction product between glycerol and 2-hydroxybenzaldehyde, the reaction product between glycerol and 3-hydroxybenzaldehyde, the reaction product between glycerol and 4-hydroxybenzaldehyde, the reaction product between trimethylolpropane and 2-hydroxybenzaldehyde, the reaction product between trimethylolpropane and 3-hydroxybenzaldehyde, the reaction product between trimethylolpropane and 4-hydroxybenzaldehyde, the reaction product between polyvinyl alcohol and 2-hydroxybenzaldehyde, the reaction product between polyvinyl alcohol and 3-hydroxybenzaldehyde, the reaction product between polyvinyl alcohol and 4-hydroxybenzaldehyde, etc. Any other reaction product between a triol or polyol and a hydroxybenzaldehyde can be used. The molecular weight of the triol or polyol is not especially limited, but should be preferably 90 to 10,000,000, more preferably 90 to 1,000,000.

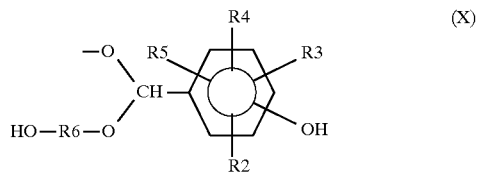

(where R2, R3, R4 and R5 are the same as the R2, R3, R4 and R5 of the general formula (II); R6 stands for, though not limited to, a sulfur atom, substituted or non-substituted nitrogen atom, substituted or non-substituted silicon atom, substituted or non-substituted alkyl groups, alkoxy groups, amido groups, acyloxy groups, alkanoyl groups, formyl groups, carboxyl groups with 1 to 100 carbon atoms, substituted or non-substituted alkenyl groups, alkenyloxy groups with 2 to 100 carbon atoms, substituted or non-substituted aryl groups, aryloxy groups with 4 to 100 carbon atoms, etc.).

(3) Compounds with a skeleton as represented by the following general formula (XI), which include, for example, though not limited to, 2-(2-hydroxyethyl)phenol, 3-(2-hydroxyethyl)phenol, 4-(2-hydroxyethyl)phenol, 2-(1-hydroxyethyl)phenol, 3-(1-hydroxyethyl)phenol, 4-(1-hydroxyethyl)phenol, 2-(3-hydroxypropyl)phenol, 3-(3-hydroxypropyl)phenol, 4-(3-hydroxypropyl)phenol, 2-(2-hydroxypropyl)phenol, 3-(-2-hydroxypropyl)phenol, 4-(2-hydroxypropyl)phenol, 2-(6-hydroxyhexyl)phenol, 3-(6-hydroxyhexyl)phenol, 4-(6-hydroxyhexyl)phenol, etc. The molecular weight of the compound is not especially limited, but should be preferably 120 to 10,000,000, more preferably 120 to 1,000,000.

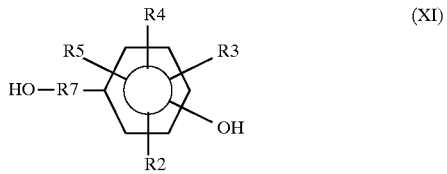

(where R2, R3, R4 and R5 are the same as the R2, R3, R4 and R5 of the general formula (II); and R7 stands for, though not limited to, a sulfur atom, substituted or non-substituted nitrogen, substituted or non-substituted silicon atom, substituted or non-substituted alkyl groups, alkoxy groups, amido groups, acyloxy groups, alkanoyl groups, formyl groups, carboxyl groups with 1 to 100 carbon atoms, substituted or non-substituted alkenyl groups, alkenyloxy groups with 2 to 100 carbon atoms, substituted or non-substituted aryl groups, aryloxy groups with 4 to 100 carbon atoms, etc.).

(4) Compounds with a skeleton as represented by the following general formula (XII), which include, for example, though not limited to, hydroxyethyl acrylate hydroxystyrene copolymer, vinyl acetate hydroxyethyl methacrylate hydroxystyrene copolymer, etc. The molecular weight of the compound is not especially limited, but should be preferably 300 to 10,000,000, more preferably 1,000 to 1,000,000.

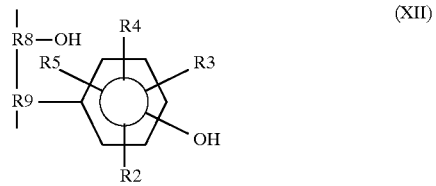

(where R2, R3, R4 and R5 are the same as the R2, R3, R4 and 5 of the general formula (II); and R8 and R9 are the main chain of the high polymer, and stand for, respectively independently, though not limited to, a sulfur atom, substituted or non-substituted nitrogen atom, substituted or non-substituted silicon atom, substituted or non-substituted alkyl groups, alkoxy groups, amido groups, acyloxy groups, alkanoyl groups, formyl groups, carboxyl groups with 1 to 100 carbon atoms, substituted or non-substituted alkenyl groups, alkenyloxy groups with 2 to 100 carbon atoms, substituted or non-substituted aryl groups, aryloxy groups with 4 to 100 carbon atoms, etc.).

Any one or more of the compounds enumerated in (1) through (4) and other compounds with at least one each of the structures represented by the general formula (I) and the structures represented by the general formula (II) are caused to react with a quinonediazide compound, to obtain the intended reaction products.

The compound with at least one of the structures represented by the general formula (I) can be selected, for example, from, though not limited to, the following compounds.

Substituted or non-substituted aliphatic alcohols, for example, monohydric saturated or unsaturated alcohols such as methanol, ethanol, propanol, butanol, hexanol, heptanol, octanol, decanol cyclohexanol, allyl alcohol, crotyl alcohol, 3-butene-1-ol, 3-butene-2-ol, 1-hexene-1-ol, 2-hexene-1-ol, 3-hexene-1-ol, 4-hexene-1-ol, 5-hexene-1-ol, 1-octene-3-ol, benzyl alcohol, naphthalene methanol, naphthalene ethanol, 3-hydroxytetrahydrofuran, ethanolamine, 2-mercaptoethanol, 1-mercapto-2-propanol, 3-mercapto-2-butanol, hydroxyethyl acrylate, and hydroxymethyl methacrylate, dihydric saturated or unsaturated alcohols such as ethylene glycol, propylene glycol, 1,3-butanediol, 1,4-butanediol, 1,6-butanediol, 1,8-octanediol, 1,10-decanediol, diethylene glycol, triethylene glycol, tetraethylene glycol, polyethylene glycol, dipropylene glycol, polypropylene glycol, 2-butene-1,4-diol, 5-hexene-1,2-diol, 7-octene-1,2-diol, and 3-mercapto-1,2-propanediol, polyhydric saturated or unsaturated alcohols such as glycerol, trimethylolpropane, 1,2,4-butanetriol, pentaerythritol, polyvinyl alcohol, cellulose and its derivatives, hydroxyethyl acrylate homopolymer and copolymers, hydroxyethyl methacrylate homopolymer and copolymers, and vinyl acetate homopolymer and copolymers respectively saponified, with 1 to 10,000,000 carbon atoms.

Among them, polyhydric saturated or unsaturated alcohols are preferable. Above all, ethylene glycol, 1,3-butanediol, 1,4-butanediol, diethylene glycol, triethylene glycol, tetraethylene glycol, polyethylene glycol, propylene glycol, polypropylene glycol, glycerol, trimethylolpropane, polyvinyl alcohol, hydroxyethyl acrylate homopolymer and copolymers, hydroxyethyl methacrylate homopolymer and copolymers, etc. are preferable.

Any one or more of these compounds and other compounds with at least one of the structures represented by the general formula (I) are caused to react with a quinonediazide compound, to obtain the intended reaction products.

The compound with at least one of the structures represented by the general formula (II) can be selected, for example, from, though not limited to, the following compounds.

Compounds with a hydroxyl group directly connected to an aromatic ring, for example, phenol, naphthol, anthranol, dihydroxyanthraquinone, dihydroxybenzophenone, trihydroxybenzophenone, tetrahydroxybenzophenone, bisphenol A, anthrarobin, phenol formaldehyde novolak resins (resins obtained by condensing a phenol such as phenol, p-tert-butylphenol, p-octylphenol, p-nonylphenol, cardanol, cresol, xylenol, catechol or pyrogallol, and a formaldehyde in the presence of an acid catalyst), resol resins (resins obtained, for example, by condensing any of the above phenols and a formaldehyde in the presence of an alkaline catalyst), resorcin benzaldehyde condensation resin, pyrogallol acetone resin, hydroxystyrene homopolymer and copolymers, etc.

Among them, dihydroxybenzophenone, trihydroxybenzophenone, tetrahydroxybenzophenone, bisphenol A, phenol formaldehyde novolak resins, resol resins, etc. are preferable, and especially, phenol formaldehyde novolak resins are preferable.

Any one or more of these compounds and other compounds with at least one of the structures represented by the general formula (II) are caused to react with a quinonediazide compound, to obtain the intended reaction products.

The quinonediazide compound in the present invention can be selected from, though not limited to, benzoquinonediazidosulfonic acid and its derivatives, naphthoquinonediazidosulfonic acid and its derivatives, for example, 1,2-benzoquinone-2-diazido-4-sulfonyl chloride, 1,2-benzoquinone-2-diazido-4-sulfonyl bromide, sodium 1,2-benzoquinone-2-diazido-4-sulfonate, potassium 1,2-benzoquinone-2-diazido-4-sulfonate, 1,2-benzoquinone-2-diazido-4-sulfonic acid, 1,2-naphthoquinone-2-diazido-4-sulfonyl chloride, 1,2-naphthoquinone-2-diazido-4-sulfonyl bromide, sodium 1,2-naphthoquinone-2-diazido-4-sulfonate, potassium 1,2-naphthoquinone-2-diazido-4-sulfonate, 1,2-naphthoquinone-2-diazido-4-sulfonic acid, 1,2-naphthoquinone-2-diazido-5-sulfonyl chloride, 1,2-naphthoquinone-2-diazido-5-sulfonyl bromide, sodium 1,2-naphthoquinone-2-diazido-5-sulfonate, potassium 1,2-naphthoquinone-9-diazido-5-sulfonate, 1,2-naphthoquinone-2-diazido-5-sulfonic acid, 1,2-naphthoquinone-2-diazido-6-sulfonyl chloride, 1,2-naphthoquinone-2-diazido-6-sulfonyl bromide, sodium 1,2-naphthoquinone-2-diazido-6-sulfonate, potassium 1,2-naphthoquinone-2-diazido-6-sulfonate, 1,2-naphthoquinone-2-diazido-6-sulfonic acid, etc. Among them, 1,2-naphthoquinone-2-diazidosulfonic acid and its derivatives, above all, 1,2-naphthoquinone-2-diazido-4-sulfonyl acid chloride, 1,2-naphthoquinone-2-diazido-5-sulfonyl chloride, sodium 1,2-naphthoquinone-2-diazido-4-sulfonate, and sodium 1,2-naphthoquinone-2-diazido-5-sulfonate are effective. The reaction product between any of these quinonediazide compounds and the compound with at least one each of the structures represented by the general formula (I) and the structures represented by the general formula (II) is usually obtained by esterification reaction, and therefore, the intended reaction product has a sulfonate structure. For example, if 1,2-naphthoquinone-2-diazido-4-sulfonyl chloride is caused to react with hydroxyethyl acrylate-hydroxystyrene copolymer, the hydroxyl group portion of the copolymer and the sulfonyl chloride portion react with each other, to form a sulfonate while hydrochloric acid is eliminated. Furthermore, the reaction product with the compound with at least one of the structures represented by the general formula (I), and also the reaction product with the compound with at least one of the structures represented by the general formula (II) can be usually similarly obtained by esterification reaction, and therefore the intended reaction products have a sulfonate structure.

Moreover, as the case may be, the compound with at least one each of the structures represented by the general formula (I) and the structures represented by the general formula (II) can be crosslinked by a crosslinking agent, to be larger in molecular weight and to be enhanced in form retainability, and the crosslinked compound and a quinonediazido compound can be caused to react with each other, to obtain a quinonediazido group-containing photosensitive compound for use as a photosensitive ingredient in the photosensitive layer. A similar method can be applied also when the photosensitive layer uses both the compound with at least one of the structures represented by the general formula (I) and the compound with at least one of the structures represented by the general formula (II). These compounds can be respectively separately crosslinked by a crosslinking agent, to be larger in molecular weight and to be enhanced in form retainability, and these compounds and a quinonediazide compound can be caused to react with each other to obtain a mixture consisting of quinonediazido group-containing photosensitive compounds, for use as a photosensitive ingredient in the photosensitive layer. In the latter case, considering the reaction with a quinonediazide compound after completion of crosslinking, it is preferably recommended to use a compound with at least two of the structures represented by the general formula (I) and a compound with at least two of the structures represented by the general formula (II). As a matter of course, the compound obtained by crosslinking, by a crosslinking agent, a compound with at least one of the structures represented by the general formula (I) and a compound with at least one of the structures represented by the general formula (II) results in a compound with at least one each of the structures represented by the general formula (I) and the structures represented by the general formula (II). This case corresponds to the former case.

The crosslinking by a crosslinking agent can be effected before the reaction with a quinonediazide compound as described before, but can also be effected after the reaction with a quinonediazide compound, or can be effected before and after the reaction. The photo-releasable photosensitive layer used in the present invention refers to a photosensitive layer which allows the ink repellent layer on it to be removed by development without substantially allowing the exposed area of the photosensitive layer to be removed. Such a photosensitive layer can be obtained by crosslinking using a crosslinking agent or combining the active group in the quinonediazide compound with a monofunctional compound for modification, to make the photosensitive layer slightly soluble or insoluble in the developing solution. On the contrary, if the crosslinking or modification is not effected, the exposed area of the photosensitive layer is removed together with the ink repellent layer by development. In the case of photo-releasable photosensitive layer, the photosensitive layer exposed by development acts as ink accepting area. If the exposed area of the photosensitive layer is removed, the substrate or the primer layer provided on the substrate described later becomes the ink accepting area.

The crosslinking agent can be selected from, though not limited to, the following polyfunctional isocyanates and polyfunctional epoxy compounds, etc.

The polyfunctional isocyanates include, though not limited to, paraphenylene diisocyanate, 2,4- or 2,6-toluylene diisocyanate (TDI), 4,4'-diphenylmethane diisocyanate (MDI), tolidine diisocyanate (TODI), xylylene diisocyanate (XDI), hydrogenated xylylene diisocyanate, cyclohexane diisocyanate, metaxylylene diisocyanate (MXDI), hexamethylene diisocyanate (HDI or HMDI), lysine diisocyanate (LDI) (=2,6-diisocyanate methylcaproate), hydrogenated MDI (H12MDI) (=4,4'-methylenebis(cyclohexyl isocyanate)), hydrogenated TDI (HTDI) (=methylcyclohexane 2,4(2,6)diisocyanate), hydrogenated XDI (H6XDI) (=1,3-(isocyanatomethyl)cyclohexane), isophorone diisocyanate (IPDI), diphenyl ether isocyanate, trimethylhexamethylene diisocyanate (TMDI), tetramethylxylylene diisocyanate, polymethylenepolyphenyl isocyanate, dimeric acid diisocyanate (DDI), triphenylmethane triisocyanate, tris(isocyanatophenyl) thiophosphate, tetramethylxylylene diisocyanate, lysine ester triisocyanate, 1,6,11-undecane triisocyanate, 1,8-diisocyanato-4-isocyanatomethyloctane, 1,3,6-hexamethylene triisocyanate, bicycloheptane triisocyanate, etc. The polyhydric alcohol adducts, polymers, etc. of polyisocyanates can also be used. The polyfunctional epoxy compounds include, though not limited to, polyethylene glycol diglycidyl ethers, polypropylene glycol diglycidyl ethers, bisphenol A diglycidyl ether, trimethylolpropane triglycidyl ether, etc. Among them, polyfunctional isocyanate compounds are preferable. The amount of the polyfunctional compound used should be preferably 1 to 150 parts by weight, more preferably 5 to 100 parts by weight, further more preferably 10 to 80 parts by weight against 100 parts by weight of the photosensitive compound.

The thermosetting of the photosensitive layer should be preferably effected in a temperature not losing the photosensitivity of the photosensitive material, usually at lower than 150° C., and for this purpose, it is preferable to use a known catalyst together.

It can also be considered to let a monofunctional compound react with a quinonediazide compound for modification, to make the photosensitive layer slightly soluble or insoluble in the developing solution. Similar methods include esterifying, amidating or urethanating the active group of the photosensitive compound. The compound to be caused to react with the active group of the photosensitive compound can be either low or relatively high in molecular weight, or a monomer can be graft-polymerized to the photosensitive compound.

The object of the present invention is to soften the photosensitive layer for enhancing the printing durability. For this reason, it is preferable that the compound with at least one each of the structures represented by the general formula (I) and the structures represented by the general formula (II), the compound with at least one of the structures represented by the general formula (I) and the compound with at least one of the structures represented by the general formula (II) are respectively soft. Among them, it is essential that the compound with at least one each of the structures represented by the general formula (I) and the structures represented by the general formula (II), and the compound with at least one of the structures represented by the general formula (I) are soft. When the compound with at least one each of the structures represented by the general formula (1) and the structures represented by the general formula (II) is used, it is preferable that 20% or more of the skeleton is formed by any other than the aromatic ring, and when the compound with at least one of the structures represented by the general formula (I) is used, 10% or more. The more the aromatic ring content, the more rigid and the less soft as a whole.

The binder polymer acting to retain the form of the photosensitive layer in the present invention can be any polymer which allows the use of an organic solvent and can form a film, and can be preferably selected from homopolymers and copolymers of 20° C. or lower, more preferably 0° C. or lower in glass transition temperature (Tg).

The glass transition temperature (Tg) refers to a transition point (temperature) at which an amorphous high polymer changes from the glass state to the rubber state (or reversely) in its physical state. In a relatively narrow temperature range with the transition point as the center, not only the elastic modulus but also such various properties as expansion coefficient, heat content, refractive index, diffusion coefficient, dielectric constant, etc. greatly change. So, the glass transition temperature can be measured by measuring the heat content in reference to the volume (specific volume) -temperature curve or thermal analysis (DSC or DTA, etc.), or measuring the properties of the material as a whole such as refractive index and rigidity, or measuring the quantities reflecting the molecular motion such as dynamic viscoelasticity, dielectric loss tangent and NMR spectrum. Customarily, a dilatometer is used for measuring the volume of a sample while raising its temperature, to identify the point at which the volume (specific volume)-temperature curve suddenly changes in gradient.

Typical polymers which can be used as binder polymers include, though not limited to, the following:

(1) Vinyl polymers

Homopolymers and copolymers obtained from the following monomers and their derivatives.

Ethylene, propylene, 1-butene, styrene, butadiene, isoprene, vinyl chloride, vinyl acetate, methyl acrylate, ethyl acrylate, isopropyl acrylate, n-butyl acrylate, 2-ethylhexyl acrylate, methyl methacrylate, ethyl methacrylate, isopropyl methacrylate, n-butyl methacrylate, isobutyl methacrylate, n-hexyl methacrylate, lauryl methacrylate, acrylic acid, methacrylic acid, maleic acid, itaconic acid, 2-hydroxyethyl methacrylate, 2-hydroxypropyl methacrylate, 2-hydroxyethyl acrylate, 2-hydroxypropyl acrylate, polyethylene glycol mono(meth)acrylate, polypropylene glycol mono(meth)acrylate, phenoxyethyl (meth)acrylate, 2-(meth)acryloxyethylhydrogen phthalate, 2-(meth)acryloxyethylhydrogen succinate, acrylamide, N-methylolacrylamide, diacetonacrylamide, glycidyl methacrylate, acrylnitrile, styrene, vinyltoluene, isobutene, 3-methyl-1-butene, butylvinyl ether, N-vinylcarbazole, methyl vinyl ketone, nitroethylene, methyl α-cyanoacrylate, vinylidene cyanide, polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa (meth)acrylate, hexanediol di(meth)acrylate, trimethylolpropane tri(acryloyloxypropyl) ether, those obtained by adding ethylene oxide or propylene oxide to a polyfunctional alcohol such as glycerol, trimethylolethane or trimethylolpropane, and (meth)acrylating the addition reaction product. Furthermore, the polymers and copolymers obtained by polymerizing and copolymerizing their derivatives can also be used as binder polymers.

Vinyl polymers of 20° C. or lower in glass transition temperature include, though not limited to, the following:

(a) Polyolefins

Poly(1-butene), poly(5-cyclohexyl-1-pentene), poly(1-decene), poly(1,1-dichloroethylene), poly(1,1-dimethylbutene), poly(1,1-dimethylpropene), poly(1-dodecene), polyethylene, poly(1-heptene), poly(1-hexene), polymethylene, poly(6-methyl-1-heptene), poly(5-methyl-1-hexene), poly(2-methylpropene), poly(1-nonene), poly(1-octene), poly(1-pentene), poly(5-phenyl-1-pentene), polypropylene, polyisobutylene, poly(1-butene), etc.

Furthermore, poly(vinylbutyl ether), poly(vinylethyl ether), poly(vinylisobutyl ether), poly(vinylmethyl ether), etc.

(b) Polystyrenes

Polystyrene derivatives of 20° C. or lower in glass transition temperature include, for example, poly(4-[(2-butoxyethoxy)methyl]styrene), poly(4-decylstyrene), poly(4-dodecylstyrene), poly[4-(2-ethoxyethoxymethyl)styrene], poly[4-(1-ethylhexyloxymethyl)styrene], poly[4-(hexyloxymethyl)styrene], poly(4-hexylstyrene), poly(4-nonylstyrene), poly[4-(octyloxymethyl)styrene], poly(4-octylstyrene), poly(4-tetradecylstyrene), etc.

(c) Acrylate and methacrylate polymers

Polyacrylates of 20° C. or lower in glass transition temperature include, for example, poly(butyl acrylate), poly(sec-butyl acrylate), poly(tert-butyl acrylate), poly[2-(2-cyanoethylthio)ethyl acrylate], poly[3-(2-cyanoethylthio)propyl acrylate], poly[2-(cyanomethylthio)ethyl acrylate], poly[6-(cyanomethylthio)hexyl acrylate], poly[2-(3-cyanopropylthio)ethyl acrylate], poly(2-ethoxyethyl acrylate), poly(3-ethoxypropyl acrylate), poly(ethyl acrylate), poly(2-ethylbutyl acrylate), poly(2-ethylhexyl acrylate), poly(5-ethyl-2-nonyl acrylate), poly(2-ethylthioethyl acrylate), poly(3-ethylthiopropyl acrylate), poly(heptyl acrylate), poly(2-heptyl acrylate), poly(hexyl acrylate), poly(isobutyl acrylate), poly(isopropyl acrylate), poly(2-methoxyethyl acrylate), poly(3-methoxypropyl acrylate), poly(2-methylbutyl acrylate), poly(3-methylbutyl acrylate), poly(2-methyl-7-ethyl-4-undecyl acrylate), poly (2-methylpentyl acrylate), poly(4-methyl-2-pentyl acrylate), poly(4-methylthiobutyl acrylate), poly(2-methylthioethyl acrylate), poly(3-methylthiopropyl acrylate), poly(nonyl acrylate), poly(octyl acrylate), poly(2-octyl acrylate), poly (3-pentyl acrylate), poly(propyl acrylate), poly (hydroxyethyl acrylate), poly(hydroxypropyl acrylate) as typical examples.

Polymethacrylates of 20° C. or lower in glass transition temperature include, for example, poly(decyl methacrylate), poly(dodecyl methacrylate), poly(2-ethylhexyl methacrylate), poly(octadecyl methacrylate), poly(octyl methacrylate), poly(tetradecyl methacrylate), poly(n-hexyl methacrylate), poly(lauryl methacrylate), etc.

(2) Unvulcanized rubbers

Natural rubber (NR) and homopolymers and copolymers of monomers selected from butadiene, isoprene, styrene, acrylonitrile, acrylates and methacrylates, for example, polybutadiene (BR), styrene-butadiene copolymer (SBR), carboxy modified styrene-butadiene copolymer, polyisoprene (NR), polyisobutylene, polychloroprene (CR), polyneoprene, acrylate-butadiene copolymers, methacrylate-butadiene copolymers, acrylate-acrylnitrile copolymer (ANM), isobutylene-isoprene copolymer (IIR), acrylonitrile-butadiene copolymer (NBR), carboxy modified acrylonitrile-butadiene copolymer, acrylonitrile-chloroprene copolymer, acrylonitrile-isoprene copolymer, ethylene-propylene copolymer (EPM, EPDM), vinylpyridine-styrene-butadiene copolymer, styrene-isoprene copolymer, etc.

In addition to the above, rubbers of 20° C. or lower in glass transition temperature include, though not limited to, poly(1,3-butadiene), poly(2-chloro-1,3-butadiene), poly(2-decyl-1,3-butadiene), poly(2,3-dimethyl-1,3-butadiene), poly(2-ethyl-1,3-butadiene), poly(2-heptyl-1,3-butadiene), poly(2-isopropyl-1,3-butadiene), poly(2-methyl-1,3-butadiene), chlorosulfonated polyethylene, etc.

These rubbers modified usually, for example, by epoxyation, chlorination, carboxylation, etc. and blends with other polymers can also be used as binder polymers.

(3) Polyoxides (polyethers)

Polymers and copolymers obtained by the ring-opening polymerization of trioxane, ethylene oxide, propylene oxide, 2,3-epoxybutane, 3,4-epoxybutene, 2,3-epoxypentane, 1,2-epoxyhexane, epoxycyclohexane, epoxycycloheptane, epoxycyclooctane, styrene oxide, 2-phenyl-1,2-epoxypropane, tetramethyl ethylene oxide, epichlorohydrin, epibromohydrin, allylglycidyl ether, phenylglycidyl ether, n-butylglycidyl ether, 1,4-dichloro-2,3-epoxybutane, 2,3-epoxypropionaldehyde, 2,3-epoxy-2-methylpropionaldehyde, 2,3-epoxydiethylacetal, etc. can also be used as binder polymers.

Polyoxides of 20° C. or lower in glass transition temperature include, for example, polyacetaldehyde, poly(butadiene oxide), poly(1-butene oxide), poly(dodecene oxide), poly(ethylene oxide), poly(isobutene oxide), polyformaldehyde, poly(propylene oxide), poly(tetramethylene oxide), poly(trimethylene oxide), etc.

(4) Polyesters

Polyesters obtained by the polycondensation between any of the following polyhydric alcohols and any of the following polycarboxylic acids, polyesters obtained by the polymerization of the following polyhydric alcohols and the following polycarboxylic anhydrides, polyesters obtained by ring-opening polymerization of the following lactones, etc., polyesters obtained from the mixtures of these polyhydric alcohols, polycarboxylic acids, polycarboxylic anhydrides and lactones, etc. can also be used.

The polyhydric alcohols include ethylene glycol, propylene glycol, 1,3-propanediol, 1,4-butanediol, 1,3-butylene glycol, 1,5-pentanediol, 1,6-hexanediol, diethylene glycol, dipropylene glycol, neopentyl glycol, triethylene glycol, p-xylylene glycol, hydrogenated bisphenol A, bisphenol dihydroxypropyl ether, glycerol, trimethylolethane, trimethylolpropane, trishydroxymethylaminomethane, pentaerythritol, dipentaerythritol, The polycarboxylic acids and polycarboxylic anhydrides include phthalic anhydride, isophthalic acid, terephthalic acid, succinic anhydride, adipic acid, azelaic acid, sebacic acid, tetrahydrophthalic anhydride, hexahydrophthalic anhydride, tetrabromophthalic anhydride, tetrachlorophthalic anhydride, "Hetic" anhydride, Nadic anhydride, maleic anhydride, fumaric acid, itaconic acid, trimellitic anhydride, methylcyclohexenetricarboxylic anhydride, pyromellitic anhydride, etc.

The lactones include β-propiolactone, γ-butyrolactone, δ-valerolactone, ε-caprolactone, etc.

Polyesters of 20° C. or lower in glass transition temperature include, for example, though not limited to, poly[1,4-(2-butene) sebacate], poly[1,4-(2-butene) sebacate]; poly(decamethylene adipate), poly(ethylene adipate), poly(oxydiethylene adipate), poly(oxydiethylene azelate), poly(oxydiethylene dodecanediate), poly(oxydiethylene glutarate), poly(oxydiethylene heptylmalonate), poly(oxydiethylene malonate), poly(oxydiethylene methylmalonate), poly(oxydiethylene nonylmalonate), poly(oxydiethylene octadecanediate), poly(oxydiethylene oxalate), poly(oxydiethylene pentylmalonate), poly(oxydiethylene pimelate), poly(oxydiethylene propylmalonate), poly(oxydiethylene sebacate), poly(oxydiethylene suberate), poly(oxydiethylene succinate), poly(pentamethylene adipate), poly(tetramethylene adipate), poly(tetramethylene sebacate), poly(trimethylene adipate), etc.

(5) Polyurethanes

The polyurethanes obtained from the following polyisocyanates and polyhydric alcohols can also be used as the binder polymers. The polyhydric alcohols include the polyhydric alcohols enumerated for the above polyesters, the following polyhydric alcohols, condensation polyester polyols with hydroxyl groups at both the ends obtained by polycondensation between any of these polyhydric alcohols and any of the polycarboxylic acids enumerated for the polyesters, polyester polyols obtained from the above lactones, polycarbonate diols, polyether polyols obtained by the ring-opening polymerization of propylene oxide and tetrahydrofuran or modification of epoxy resins, acrylic polyols as copolymers between an acrylic (or methacrylic) monomer with a hydroxyl group and an acrylate (or methacrylate), polybutadiene polyols, etc.

The isocyanates include paraphenylene diisocyanate, 2,4- or 2,6-toluylene diisocyanate (TDI), 4,4-diphenylmethane diisocyanate (MDI), tolidine diisocyanate (TODI), xylylene diisocyanate (XDI), hydrogenated xylylene diisocyanate, cyclohexane diisocyanate, metaxylylene diisocyanate (MXDI), hexamethylene diisocyanate (HDI or HMDI), lysine diisocyanate (LDI) (=2,6-diisocyanate methylcaproate), hydrogenated MDI (H12MDI) (=4,4'-methylenebis(cyclohexylisocyanate)), hydrogenated TDI (HTDI) (=methylcyclohexane 2,4(2,6)diisocyanate), hydrogenated XDI (H6XDI) (=1,3-(isocyanatomethyl) cyclohexane), isophorone diisocyanate (IPDI), diphenyl ether isocyanate, trimethylhexamethylene diisocyanate (TMDI), tetramethylxylylene diisocyanate, polymethylene-polyphenyl isocyanate, dimeric acid diisocyanate (DDI), triphenylmethane triisocyanate, tris(isocyanatophenyl) thiophosphate, tetramethylxylylene diisocyanate, lysine ester triisocyanate, 1,6,11-undecane triisocyanate, 1,8-diisocyanato-4-isocyanatomethyloctane, 1,3,6-hexamethylene triisocyanate, bicycloheptane triisocyanate, etc. The polyhydric alcohol adducts, polymers, etc. of polyisocyanates can also be used.

Typical polyhydric alcohols other than those enumerated for the above polyesters include polypropylene glycol, polyethylene glycol, polytetramethylene glycol, ethylene oxide-propylene oxide copolymer, tetrahydrofuran-ethylene oxide copolymer, tetrahydrofuran-propylene oxide copolymer, etc. The polyester diols include polyethylene adipate, polypropylene adipate, polyhexamethylene adipate, polyneopentyl adipate, polyhexamethyleneneopentyl adipate, polyethylenehexamethylene adipate, etc., and furthermore, poly-ε-caprolactonediol, polyhexamethylenecarbonatodiol, polytetramethylene adipate, metylglucoside, sorbitol, sucrose, etc.

Moreover, various phosphorus-containing polyols, halogen-containing polyols, etc. can also be used as polyols.

In addition, branched polyurethane resins and polyurethane resins with various functional groups such as hydroxyl groups can also be used as the binder polymers.

Further polyurethanes which can be used include, though not limited to, poly(tetramethylenehexamethylene-urethane), poly(1,4-(2-butene)hexamethylene-urethane), poly(1,4-(2-butyne)hexamethylene-urethane), etc.

These polyurethanes are generally 20° C. or lower in glass transition temperature.

(6) Polyamides

The polyamides proposed conventionally can also be used as the binder polymers. The basic composition is any of the copolymers of the following monomers; ε-caprolactam, ω-laurolactam, ω-aminoundecanoic acid, hexamethylenediamine, 4,4'-bis-aminocyclohexylmethane, 2,4,4-trimethylhexamethylenediamine, isophoronediamine, diglycols, isophthalic acid, adipic acid, sebacic acid, dodecanoic diacid, etc.

To describe in more detail, polyamides can be generally classified into water soluble polyamides and alcohol soluble polyamides. The water soluble polyamides include the polyamides containing sulfonic acid groups or sulfonate groups obtained by copolymerizing sodium 3,5-dicarboxybenzenesulfonate, etc. as disclosed in Japanese Patent Laid-Open (Kokai) SHO 48-72250, the polyamides with ether bonds obtained by copolymerizing any one of dicarboxylic acids, diamines and cyclic amides with an ether bond in the molecule as disclosed in Japanese Patent Laid-Open (Kokai) SHO 49-43465, the polyamides containing basic nitrogen obtained by copolymerizing N,N'-di(γ-aminopropyl,piperazine, etc. and the quaternary polyamides obtained by converting these polyamides by acrylic acid, etc. as disclosed in Japanese Patent Laid-Open (Kokai) SHO 50-7605, the copolymerized polyamides containing polyether segments of 150 to 1500 in molecular weight proposed in Japanese Patent Laid-Open (Kokai) SHO 55-74537, and polyamides obtained by the ring-opening, polymerization of a -(N,N'-dialkylamino)-ε-caprolactams and by the ring-opening copolymerization between any of α-(N,N'-dialkylamino)-ε-caprolactams and ε-caprolactam, etc.

The alcohol soluble polyamides include linear polyamides synthesized from a dibasic acid fatty acid and a diamine, ω-amino acid, lactam or any of their derivatives by any conventional method. Not only homopolymers, but also copolymers, block polymers, etc. can be used. Typical examples are nylons 3, 4, 5, 6, 8, 11, 12, 13, 66, 610, 6/10 and 13/13, polyamide obtained from metaxylylenediamine and adipic acid, polyamides obtained from trimethylhexamethylenediamine or isophoronediamine and adipic acid, ε-caprolactam/adipic acid/hexamethylenediamine/4,4'-diaminodicyclohexylmethane copolymerized polymer, ε-caprolactam/adipic acid/hexamethylenediamine/2,4,4'-trimethylhexamethylenediamine copolymerized polyamide, ε-caprolactam/adipic acid/hexamethylenediamine/ isophoronediamine copolymerized polyamide, polyamides containing any of these components, their N-methylol and N-alkoxymethyl derivatives, etc. One or more as a mixture of these polyamides can be used as the binder polymer.

Polyamides of 20° C. or lower in glass transition temperature Tg include, though not limited to, copolymerized polyamides containing polyether segments of 150 to 1500 in molecular weight, which include, though not limited to, copolymerized polyamides containing 30 to 70 wt % of a component consisting of polyoxyethylene and an aliphatic dicarboxylic acid or a diamine, of 150 to 1500 in the molecular weight of the polyether segment with amino groups at the ends.

The polymers which can be the binder polymers can be used alone or as a mixture of plural polymers.

Among the binder polymers, polyurethanes, polyesters, vinyl polymers, and unvulcanized rubbers are preferable.

The amount of the binder polymer used is not limited as far as the photosensitive layer can have image reproducibility. To sufficiently achieve the tensile properties of the photosensitive layer intended in the present invention, it is preferable to use the binder polymer by 10 to 90 wt %, more preferably 15 to 65 wt %, further more preferably 20 to 55 wt % based on the weight of the photosensitive layer ingredients.

The most preferable composition is a combination consisting of 10 to 90 wt %, based on the weight of the photosensitive layer ingredients, of a binder polymer and the reaction product between a compound with at least one each of the structures represented by the general formula (I) and the structures represented by the general formula (II) and a quinonediazide compound (for example, a sulfonate reaction product by the reaction product between glycerol and 4-hydroxybenzaldehyde, and 1,2-naphthoquinone-2-diazido-5-sulfonic acid chloride, of 10 to 90% in the entire esterification rate), or a combination consisting of 10 to 90 wt %, based on the weight of the photosensitive layer ingredients, of a binder polymer and the reaction product between a compound with at least one of the structures represented by the general formula (I) and a quinonediazide compound (for example, a sulfonate reaction product by glycerol and 1,2-naphthoquinone-2-diazido-4-sulfonic acid chloride, of 10 to 90% in the entire esterification rate), or a combination consisting of 10 to 90 wt %, based on the weight of the photosensitive layer ingredients, of a binder polymer and the reaction product between a compound with at least one of the structures represented by the general formula (II) and a quinonediazide compound (for example, a sulfonate reaction product by phenol formaldehyde novolak resin and 1,2-naphthoquinone-2-diazido-5-sulfonic acid chloride, of 10 to 90% in the entire esterification rate).

If the esterification rate is less than 5% when a quinonediazidosulfonate is used, the number of photosensitive groups is so small as to lower the image reproducibility and developability. On the other hand, if the esterification rate is higher than 95%, the number of remaining hydroxyl groups, i.e., the number of crosslinking points is so small that the solvent resistance of the photosensitive layer and the bonding strength between the ink repellent layer and the photosensitive layer may be lowered.

If the amount of the binder polymer is less than 10 wt %, it is difficult to let the photosensitive layer have sufficient physical properties, and on the other hand, if more than 90 wt %, the amount of the photosensitive compound is so small that the image reproducibility, developability and the bonding strength between the ink repellent layer and the photosensitive layer are lowered.

In addition to the above ingredients, additives such as photo-sensitizer, acid, base, dye, pigment, photo-coupler, surfactant and catalyst can be added as required. Especially to enhance the sensitivity and testability of the exposed and developed printing plate, using one or more, in combination, of any proper photo-sensitizer, dye, pigment, photo-coupler, etc. allows a raw plate excellent in visible image reproducibility to be produced.

The photo-sensitizer can be selected, for example, from, though not limited to, quinonediazido group-containing compounds such as 1,2-naphthoquinone-2-diazido-4-sulfonic acid, 1,2-naphthoquinone-2-diazido-4-sulfonyl chloride, 1,2-naphthoquinone-2-diazido-4-sulfonyl bromide, sodium 1,2-naphthoquinone-2-diazido-4-sulfonate, potassium 1,2-naphthoquinone-2-diazido-4-sulfonate, 1,2-naphthoquinone-2-diazido-5-sulfonic acid, 1,2-naphthoquinone-2-diazido-5-sulfonyl chloride, 1,2-naphthoquinone-2-diazido-5-sulfonyl bromide, sodium 1,2-naphthoquinone-2-diazido-5-sulfonate, potassium 1,2-naphthoquinone-2-diazido-5-sulfonate, 1,2-benzoquinone-2-diazido-4-sulfonic acid, 1,2-benzoquinone-2-diazido-4-sulfonyl chloride, 1,2-benzoquinone-2-diazido-4-sulfonyl bromide, sodium 1,2-benzoquinone-2-diazido-4-sulfonate, and potassium 1,2-benzoquinone-2-diazido-4-sulfonate, benzoin derivatives such as benzoin methyl ether, benzoin isopropyl ether, and α,α-dimethoxy-α-phenylacetophenone, benzophenone, fluorenone, xanthone, thioxanthone, N-methylacridone, N-butylacridone, 4,4'-bis(dimethylamino)benzophenone, 4,4'-bis(diethylamino) benzophenone, 2-chlorothioxanthone, 2-isopropylthioxanthone, 2,4-diethylthioxanthone, etc. Among them, quinonediazido group-containing compounds and benzophenones are especially effective.

The mixing ratio of the respective ingredients in the photosensitive layer described above can be, for example, though not limited to, 1 to 100 parts by weight of a photosensitive compound, 0 to 10,000 parts by weight of a crosslinking agent or a compound to be caused to react with the active group of the photosensitive compound, 0 to 10,000 parts by weight of a binder polymer, 0 to 100 parts of a photo-initiator or photo-sensitizer, and as required, respectively 0 to 100 parts by weight of such additives as an acid, base, dye, pigment, photo-coupler, surfactant and catalyst. It is appropriate that the thickness of the photosensitive layer is 0.1 to 100 μm, preferably about 0.5 to 10 μm. If the thickness is too thin, pinholes are liable to be formed in the photosensitive layer, and on the other hand, if too thick, it is uneconomical.

The substrate used in the present invention can be any substrate used for ordinary water-less lithographic printing plates. That is, any substrate which is flexible enough to allow installation in an ordinary lithographic press and resistant against the load applied during printing can be used.

It can be selected, for example, from metallic sheets made of aluminum, copper, zinc or steel, etc., metallic sheets with chromium, zinc, copper, nickel, aluminum or iron, etc. plated or vapor-deposited, plastic films and sheets made of polyethylene terephthalate, polyethylene naphthalate, polyethylene, polystyrene, or polypropylene, etc., substrates made of a rubber-like resilient material such as chloroprene rubber or NBR, substrates with such rubber resiliency, paper, resin coated paper, and paper covered with a metal foil such as aluminum. The substrate can also be coated with a further other material for the purpose of preventing halation, etc.

Among the above substrates, metallic sheets are preferable, and above all, a metallic sheet using aluminum is preferable. Such a metallic sheet can be used as it is, or treated to be plain by degreasing treatment using an alkaline aqueous solution. It can also be treated by any mechanical method or electrolytic etching, etc., to look like being grained. In this case, it can also be treated for degreasing before the grain-like finish treatment. The mechanical method can be selected, for example, from pole grinding, brushing, liquid honing, buffing, etc. The abrasive used for the mechanical grinding can be selected from alumina, silicon carbide, boron carbide, diamond, sand, silica rock, granite, limestone., artificial emery, steel balls, iron pieces, alundum, bamiston, magnesium oxide, etc., and is of desired grain size. Electrolytic etching can be effected by using a solution containing phosphoric acid, sulfuric acid, perchloric acid, hydrochloric acid, nitric acid, pyrophosphoric acid or hydrofluoric acid, etc. To produce a surface-roughened metallic sheet, various methods described above can be properly selected for use in combination, depending on the composition of the metallic sheet, etc. Any one or more, in combination, of the above methods can be used.

The electrolytic etching uses a bath containing one or more as a mixture selected from the above acids. A preferable bath contains one or more as a mixture selected from sulfuric acid, phosphoric acid, hydrochloric acid and nitric acid. Furthermore, an organic material such as an alcohol, acetic anhydride or unsaturated carboxylic acid, an inorganic material such as potassium dichromate or hydrogen peroxide, a colloid such as gelatin or starch, glycerol or any other viscous material, surfactant, etc. can also be added as additives to the bath. One or more, in combination, of the additives can be used. The electrolytic etching bath is prepared by adding any of the above acids, and as required, the above additives to water.

In the electrolytic etching, it is preferable that the bath temperature is in a range from 5° to 80° C., more preferably 10° to 50° C., and that the current density is in a range from 5 to 300 A/dm$^2$, more preferably 10 to 200 A/dm$^2$.

After completion of the above degreasing treatment, grain-like finish treatment, etc., the substrate can also be immersed in 1 to 10% sodium metasilicate aqueous solution at a temperature of 60° to 90° C. for 20 to 90 seconds, furthermore immersed in water of pH 7.5 to 9.5 and 10° to 90° C. for 10 to 90 seconds, washed by water and dried.

In the water-less lithographic printing plate of the present invention, the bonding between the substrate and the photosensitive layer is very important for basic plate performance such as image reproducibility and printing durability. So, it is preferable to form a primer layer on the substrate before coating the substrate with the photosensitive layer, to ensure sufficient bonding between the photosensitive layer and the substrate.

It is preferable that the ingredients constituting the primer layer in the present invention are selected to ensure that the tensile properties of the primer layer alone or of the sheet of both the primer layer and the photosensitive layer are as follows:

(1) Initial elastic modulus: 5 to 50 kgf/mm$^2$ (2) 10% stress: 0.05 to 3.0 kgf/mm$^2$ (3) Rupture elongation: 10% or more The tensile properties of the primer layer alone or the sheet consisting of both the primer layer and the photosensitive layer can be measured according to JIS K 6301. A glass sheet is coated with a primer solution, and after the solvent is volatilized, the coated film is heated to be hardened. Then, the hardened sheet is removed from the glass skeet, as an about 100-micron thick primer sheet. From the sheet, 5 mm×40 mm strip samples are obtained by cutting, and tested using Tensilon RTM-100 (produced by Orienteck K.K.) at a tensile speed of 20 cm/min, to measure the initial elastic modulus, 10% stress and rupture elongation. To measure the tensile properties of the sheet consisting of the primer layer and the photosensitive layer, a primer sheet is prepared, and a photosensitive sheet is formed on it similarly, to make the desired sample.

To let the primer layer have the above physical properties, it is preferable that the primer layer contains any of the following binder polymers described for the photosensitive layer, as an ingredient.

(1) Vinyl polymers
  (a) Polyolefins
  (b) Polystyrenes
  (c) Acrylate and methacrylate polymers
(2) Unvulcanized rubbers
(3) Polyoxides (polyethers)
(4) Polyesters
(5) Polyurethanes
(6) Polyamides The binder polymer can also be selected from, though not limited to, the following, and any other binder polymer which can let the primer layer or the sheet consisting of the primer layer and the photosensitive layer have the tensile properties of the present invention can be used.

Urea resin, phenol resins, benzoguanamine resins, phenoxy resins, diazo resins, cellulose and its derivatives, chitin, chitosan, milk casein, gelatin, soybean protein, albumin, etc.

Any one or more as a mixture of these binder polymers can be used, as required, together with any of the crosslinking agents enumerated for the photosensitive layer.

Among them, it is preferable that an acrylate polymer, methacrylate polymer, unvulcanized rubber, polyurethane resin, polyoxide, urea resin, diazo resin, milk casein, or gelatin, etc. is used alone or as a mixture with another binder polymer. Especially it is preferable to use an acrylate polymer, methacrylate polymer, unvulcanized rubber, polyurethane, polyoxide or urea resin, etc. alone or as a mixture with another binder polymer.

The amount of the binder polymer used is not limited as far as the bonding between the substrate and the photosensitive layer can be achieved, but to let the primer layer have satisfactory tensile properties of the present invention, it is preferable to use the binder polymer by 5 to 100 wt %, more preferably 10 to 99 wt %, further more preferably 20 to 95 wt % based on the weight of the primer layer ingredients.

The anchoring agent used in the primer layer can be, for example, a silane coupling agent, and it is also effective to use an organic titanate, etc.

To prevent the halation from the substrate or to enhance plate testability, it is also possible to add a white pigment or yellow pigment such as titanium oxide, calcium carbonate or zinc oxide. Furthermore, to enhance coatability, a surfactant, etc. can also be added.

The composition for forming the above primer layer can be prepared as a composition solution by dissolving in a proper organic solvent such as dimethyl formamide, methyl ethyl ketone, methyl applied onto a or dioxane, etc. The composition solution is uniformly applied onto a substrate, and heated at a necessary temperature for a necessary time, to form the intended primer layer.

The thickness of the primer layer should be 0.1 to 100 μm, preferably 0.3 to 50 μm, more preferably 0.5 to 30 μm. If the thickness is too thin, the primer is less effective in being kept away from the form defects and chemical adverse effect of the surface of the substrate. If too thick on the other hand, it is uneconomical.

The mixing ratio of the respective ingredients in the primer layer is not especially limited, but should be preferably 100 parts by weight of one or more of the above binder polymers, as required 0 to 100 parts by weight of a crosslinking agent, respectively 0 to 100 parts by weight of additives such as dye or pigment, and 0 to 10 parts by weight of a conventional catalyst.

In the water-less lithographic printing plate of the present invention, the bonding between the photosensitive layer and the ink repellent layer is very important for basic performance such as image reproducibility and printing durability. So, as required, an adhesive layer can be provided between both the layers, or an adhesiveness improving ingredient can be added into the respective layers. For the bonding between the photosensitive layer and the ink repellent layer, it is effective to use a known silicone primer or silane coupling agent between the layers, or to add a silicone primer or silane coupling agent into the ink repellent layer or photosensitive layer.

The ink repellent layer used in the present invention can be formed by using, for example, though not limited to, a silicone rubber or fluorine resin, or any other known ink repellent layer which can be used for water-less lithographic printing plates can be used also in the present invention.

If a silicone rubber is used for the ink repellent layer, the silicone rubber layer is mainly made of a linear organic polysiloxane of thousands to tens of thousand in molecular weight usually consisting of a component represented by the following general formula (XIII):

(where n stands for an integer of 2 or more; and R10 and R11 stand for, respectively independently, at least one selected from a group consisting of substituted or non-substituted alkyl groups with 1 to 50 carbon atoms, substituted or non-substituted alkenyl groups with 2 to 50 carbon atoms, and substituted or non-substituted aryl groups with 4 to 50 carbon atoms; it is preferable that 40% or less of all the groups denoted by R10 and R11 are vinyl, phenyl, vinyl halides and phenyl halides, while 60% or more are methyl groups).

Such a linear organic polysiloxane can also have an organic peroxide added and thermally treated, to be converted into a crosslinked silicone rubber.

To the linear organic polysiloxane, usually a crosslinking agent as represented by the following general formula (XIV) is added for crosslinking.

(where m stands for an integer of 0 to 2; R12 stands for an alkyl group, alkenyl group, aryl group or a combination of them, with or without a functional group such as a halogen atom, amine group, hydroxy group, alkoxy group, aryloxy group, (meth)acryloxy group or thiol group, etc. as a substituent group; X stands for a functional group such as a hydrogen atom, hydroxyl group, alkoxy group, acyloxy group, ketoxime group, amido group, aminoxy group, amino group or alkenyloxy group, etc.).

The crosslinking agent can be a polyfunctional silane compound used for so-called room temperature (low temperature) setting type silicone rubbers as stated above, and can be selected, for example, from, though not limited to, acetoxysilanes, ketoximesilanes, alkoxysilanes, aminosilanes, amidosilanes, etc. with trimethoxysilyl group, amino group, glycidyl group, methacryl group, allyl group or vinyl group, etc.

Any of these is usually combined with a linear organic polysiloxane with hydroxyl groups at the ends, to produce an acetic acid-removed, oxime-removed, alcohol-removed, amine-removed or amide-removed silicone rubber, etc.

To the silicone rubber to be subjected to such condensation type crosslinking, a catalyst such as a metal carboxylate of tin, zinc, lead, calcium or manganese, for example, dibutyltin laurate, tin (II) octoate, naphthenate or chloroplatinic acid, or any other known catalyst can also be added.

Furthermore, a radical initiator can also be used to harden the linear organic polysiloxane, for producing the intended silicone rubber. In this case, a proper amount of a known radical initiator can also be added.

Furthermore, an addition type silicone rubber layer crosslinked by the addition reaction between SiH groups and —CH=CH— groups is also useful. The addition type silicone rubber layer used here is obtained by the reaction between a poly-hydrogen organopolysiloxane and a polysiloxane compound with two or more —CH=CH— bonds per molecule, desirably obtained by crosslinking and hardening a composition consisting of the following ingredients:

(1) An organopolysiloxane with at least two alkenyl groups (desirably vinyl groups) directly connected to silicon atoms per molecule (2) An organopolysiloxane with at least two SiH bonds per molecule (3) An addition catalyst The alkenyl groups of the ingredient (1) can be located at the ends or intermediate positions of the molecular chain. The other groups than alkenyl groups include, though not limited to, substituted or non-substituted alkyl groups, aryl groups, etc. The ingredient (1) may contain a slight amount of hydroxyl groups. The ingredient (2) reacts with the ingredient (1), to form a silicone rubber layer, and also acts to produce the adhesiveness to the photosensitive layer. The hydrogen groups of the ingredient (2) can be located at the ends or intermediate positions of the molecular chain. The organic groups other than hydrogen can be selected from the same groups as in the ingredient (1). As for the organic groups of the ingredients (1) and (2), it is preferable in view of enhanced ink repellency that 60% or more of all the groups are methyl groups. The molecular structures of the ingredients (1) and (2) can be straight chain, cyclic or branched, and it is preferable in view of physical properties of rubber that at least either of the ingredients (1) and (2) is more than 1,000 in molecular weight, and it is more preferable that the ingredient (1) is more than 1,000 in molecular weight.

The ingredient (1) can be selected, for example, from, though not limited to, α, ω-divinylpolydimethylsiloxane and (methylsiloxane) (dimethylsiloxane) copolymer with methyl groups at both the ends, etc. The ingredient (2) can be selected, for example, from, though not limited to, polydimethylsiloxane with hydrogen groups at both the ends, α, ω-dimethylpolymethylhydrogensiloxane, (methylpolymethylhydrogensiloxane) (dimethylsiloxane) copolymer with methyl groups at both the ends, cyclic polymethylhydrogensiloxane, etc.

The addition catalyst as the ingredient (3) can be selected from known catalysts. Especially a platinum based compound is desirable, which can be selected from platinum, platinum chloride, olefin coordination platinum, etc. For the purpose of controlling the hardening speed of the composition, a proper amount of a crosslinking inhibitor can also be added, which can be selected from vinyl group-containing organopolysiloxanes such as tetracyclo (methylvinyl)siloxane, alcohols of carbon-carbon triple bond, acetone, methyl ethyl ketone, methanol, ethanol, propylene glycol monomethyl ether, etc.

In addition to these ingredients, it is also allowed to add a known adhesiveness donor such as an alkenyltrialkoxysilane, or add a hydroxyl group-containing organopolysiloxane, a silicone oil composed of dimethylpolysiloxane with trimethylsilyl groups at the ends, dimethylpolysiloxane with trimethylsilyl groups at the ends, or hydrolyzable functional group-containing silane (or siloxane), as a condensation type silicone rubber layer ingredient. Furthermore, to enhance the rubber strength, a known filler such as silica can also be added.

It is important that the tensile properties of the silicone rubber layer are 0.008 to less than 0.09 kgf/mm$^2$, preferably 0.012 to less than 0.07 kg/mm$^2$ in initial elastic modulus, 0.005 to less than 0.04 kgf/mm$^2$, preferably 0.007 to less than 0.025 kgf/mm$^2$ in 50% stress.

If the initial elastic modulus is less than 0.008 kgf/mm$^2$ and/or 50% stress is less than 0.005 kgf/mm$^2$, the printing durability is too low. On the other hand, if the initial elastic modulus is 0.09 kgf/mm$^2$ or more and/or the 50% stress is 0.04 kgf/mm$^2$ or more, for example, if the silicone rubber layer is 0.15 kgf/mm$^2$ in initial elastic modulus and 0.06 kgf/mm$^2$ in 50% stress as stated in Example 1 of Japanese Patent Publication (Koho) SHO 56-23150, the silicone rubber layer is so hard as to be low in ink repellency and scratch resistance.

Furthermore, it is important that the elongation of the silicone rubber layer is 100% or more, preferably 150% to less than 1200%. If the elongation is less than 100%, the printing durability is too low.

The tensile properties of the silicone rubber can be measured according to JIS K 6301. For example, a teflon sheet is coated with a silicone rubber solution and dried, and the dried sheet is removed from the teflon sheet. From the about 300-micron thick sheet obtained, test pieces are prepared using a 4 dumbbell and tested using the above mentioned Tensilon at a tensile speed of 20 cm/min, to measure the initial elastic modulus, 50% stress and rupture elongation.

The proper thickness of the silicone rubber layer is about 0.5 to 100 μm, preferably about 0.5 to 10 μm. If the thickness is too thin, the printing durability and the ink repellency are poor. On the other hand, if too thick, it is uneconomical, and it is difficult to remove the silicone rubber layer at the time of development, while the image reproducibility is lowered.

The mixing ratio of the respective ingredients of the silicone rubber layer is not especially limited, but is recommended to be 100 parts by weight of a linear organic polysiloxane, 0.1 to 100 parts by weight of a silicon compound with hydrolyzable functional groups directly connected to silicon atoms, and as required, 0 to 50 parts by weight of a known catalyst in the case of a silicone rubber layer to be subjected to condensation type crosslinking. In the case of addition type silicone rubber layer, the mixing ratio is recommended to be 100 parts by weight of an organopolysiloxane with at least two alkenyl groups (desirably vinyl groups) directly connected to silicon atoms per molecule, 0.1 to 100 parts by weight of an organopolysiloxane with at least two SiH bonds per molecule, and as required, 0 to 50 parts by weight of an addition catalyst.

If a fluorine resin is used as the ink repellent layer, it can be selected, for example, from, though not limited to, the following:

(1) Copolymer resins consisting of a perfluoroalkyl methacrylate and an acrylic monomer with a hydroxy group such as 2-hydroxyethyl methacrylate (2) Copolymer resins consisting of a perfluoroalkyl methacrylate and glycidyl methacrylate (3) Copolymer resins consisting of a perfluoroalkyl methacrylate and methacrylic acid (4) Copolymer resins consisting of a perfluoroalkyl methacrylate and maleic anhydride If the fluorine resin selected has both an active hydrogen functional group and a functional group capable of reacting with active hydrogen, or if a fluorine resin with an active hydrogen functional group and a fluorine resin with a functional group capable of reacting with active hydrogen are mixed to be used, a crosslinking agent may be used.

The proper thickness of the fluorine resin layer is about 0.5 to 100 µm, preferably about 0.5 to 10 µm. If it is too thin, the printing durability and the ink repellency are poor. If it is too thick on the other hand, it is uneconomical, and it is difficult to remove the fluorine resin layer at the time of development, while the image reproducibility is lowered.

The mixing ratio of the respective ingredients in the fluorine resin layer is not especially limited, but it is preferable that the fluorine resin content is 60 to 100 wt %, more preferably 80 to 89 wt % of the entire layer.

In the water-less lithographic raw plate composed as described above, a thin protective film treated to be plain or rough on the surface can also be formed as a protective layer by lamination or coating or transfer on the surface of the ink repellent layer for the purposes of protecting the surface of the ink repellent layer and to improve the vacuum contact with the negative film in the step of exposure. The protective film or layer is useful in the step of exposure, but is removed by peeling or dissolving in the step of development, being unnecessary in the step of printing.

A useful protective film has ultraviolet ray permeability and has a thickness of 100 microns or less, preferably 10 microns or less, being typically made of polyethylene, polypropylene, polyvinyl chloride, polyethylene terephthalate or cellophane. The protective film can be treated to be rough on the surface to achieve better contact with the negative film in the step of exposure. A protective layer can also be formed by coating, etc. instead of using a protective film.

The water-less lithographic printing plate used in the present invention can be produced, for example, as described below. At first, a substrate treated to be rough on the surface by any of various methods is coated with a composition solution destined to be a photosensitive layer by any ordinary coater such as reverse roll coater, air knife coater, or a rotary coater such as whirler, dried, and as required, thermally cured. As required, a primer layer can be formed between the substrate and the photosensitive layer by any similar method, and as required, an adhesive layer can be applied and dried on the photosensitive layer. Then, a solution destined to form an ink repellent layer is applied onto the photosensitive layer or onto the adhesive layer by a similar method, and usually treated in wet heat at a temperature of 60° to 130° C. for several minutes, to be sufficiently hardened, being formed as an ink repellent layer. As required, a protective layer or film is applied by coating or lamination onto the ink repellent layer.

The water-less lithographic printing plate thus produced is exposed through a negative film kept in vacuum contact with it to active light. In this case, if the protective film has light permeability, it can remain as it is, or be removed, and if it is poor in light permeability, it should be removed before exposure. The light source used in the step of exposure should generate ultraviolet rays abundantly, and can be selected from a mercury lamp, carbon arc lamp, xenon lamp, metal halide lamp, tungsten lamp, fluorescent lamp, etc.

Subsequently, the protective film, if remaining, is removed, and the plate is rubbed by a developing pad containing a developing solution, to remove the ink repellent layer in the exposed area, and as the case may be, also the photosensitive layer below it, for exposing the photosensitive layer or primer layer which is the ink accepting area.

The developing solution used in the present invention can be selected from those usually proposed for water-less lithographic printing plates. For example, it can be preferably prepared by, though not limited to, adding any of the following polar solvents alone or together with water, to water, an aqueous solution with any of the following polar solvents dissolved in it, aliphatic hydrocarbon (hexane, heptane, "Isopar" E, G, H (produced by Exone Kagaku K.K.), gasoline, or kerosene, etc.), aromatic hydrocarbon (toluene or xylene, etc.) or halogenated hydrocarbon (trichlene, etc.), or can be any of the following polar solvents alone.

Alcohols (methanol, ethanol, propanol, benzyl alcohol, ethylene glycol monophenyl ether, 2-methoxyethanol, carbitol monoethyl ether, carbitol monomethyl ether, triethylene glycol monoethyl ether, propylene glycol monomethyl ether, propylene glycol monoethyl ether, dipropylene glycol monomethyl ether, polyethylene glycol monomethyl ether, propylene glycol, polypropylene glycol, triethylene glycol, tetraethylene glycol, etc.)

Ethers (methyl cellosolve, ethyl cellosolve, butyl cellosolve, methylcarbitol, ethylcarbitol, butylcarbitol, dioxane, etc.)

Ketones (acetone, methyl ethyl ketone, 4-methyl-1,3-dioxolan-2-one, etc.)

Esters (methyl acetate, ethyl acetate, methyl lactate, ethyl lactate, butyl lactate, cellosolve acetate, methyl cellosolve acetate, carbitol acetate, propylene glycol monomethyl ether acetate, dimethyl phthalate, diethyl phthalate, etc.)

Others (triethyl phosphate, etc.)

The developing solution can also contain any of various surfactants such as anionic surfactants, nonionic surfactants, cationic surfactants and amphoteric surfactants, and an alkali. The alkali can be selected, for example, from inorganic alkalis such as sodium carbonate, sodium silicate, sodium hydroxide, potassium hydroxide and sodium borate, organic amine compounds such as mono-, di-, and triethanolamines, mono-, di-, and trimethylamines, mono-, di-, and triethylamines, mono- and diisopropylamines, n-butylamine, mono-, di-, and triisopropanolamines, ethyleneimine and ethylenediimine.

Furthermore, a dye such as Crystal Violet or Anthrazol Red, and color coupler can also be added to the developing solution, for dyeing or coloring the image area simultaneously with development. As another method, the developed plate can be immersed in a dyeing solution, to be dyed as post-treatment.

The development can be effected manually or using any known processor, but it is preferable to use a processor consisting of a pre-treating section, developing section and post-treating section. The processor can be selected, for example, from such processors as TWL-1160 and TWL-650 produced by Toray Industries, Inc. and processors disclosed in Japanese Patent Laid-Open (Kokai) HEI 5-2265, 5-2272, and 5-6000. Furthermore, these processors can be used in proper combination.

The present invention is described below in more detail in reference to examples, but is not limited thereto or thereby.

Tensile properties were tested according to the following methods:

[Photosensitive layer and primer layer]
(1) Tensile properties before exposure

The tensile properties of a photosensitive layer, or a primer layer, or a sheet consisting of a photosensitive layer and a primer layer were measured according to JIS K 6301. A glass sheet was coated with a primer solution or sensitizing solution, and after the solvent was volatilized, the solution on the glass sheet was heated to be hardened. Then, the hardened sheet was removed from the glass sheet, as an about 100-micron thick sheet. From the sheet, 5 mm×40 mm thick strip samples were taken by cutting, and tested using Tensilon RTM-100 (produced by Orienteck K.K.) at a tensile speed of 20 cm/min, to measure the initial elastic modulus, 10% stress and rupture elongation. To examine the tensile properties of a sheet consisting of a primer layer and a photosensitive layer, the photosensitive layer was formed on the primer layer according to the above method, and a hardened sheet was obtained similarly.

(2) Tensile properties after completion of exposure

The tensile properties of a photosensitive layer or a sheet consisting of a photosensitive layer and a primer layer after completion of exposure were measured according to JIS K 6301. A glass sheet was coated with a sensitizing solution, after the solvent was volatilized, the solution on the glass sheet was heated to be hardened. Then, it was exposed using a 3 kW extra-high pressure mercury lamp (produced by Oak Seisakusho) at an illuminance of 12 mW/cm identified by a UV meter (Light Measure type UV365 produced by Oak Seisakusho) for 10 minutes. Then, the exposed sheet was removed from the glass sheet, as an about 100-micron thick sheet. From the sheet, 5 mm×40 mm strip samples were taken by cutting, and tested using Tensilon RTM-100 (produced by Orienteck K.K.) at a tensile speed of 20 cm/min, to measure the initial elastic modulus, 10% stress and rupture elongation. To examine the tensile properties of a sheet consisting of a primer layer and a photosensitive layer, the photosensitive layer was formed on the primer layer according to the above method, and an exposed sheet was obtained similarly.

[Silicone rubber layer]

The tensile properties of a silicone rubber layer were also measured according to JIS K 6301. A teflon sheet was coated with a silicone rubber solution, and dried, and the dried sheet was removed from the teflon sheet, as an about 300-micron thick sheet. From it, test pieces were prepared using a 4 dumbbell and tested using said Tensilon at a tensile speed of 20 cm/min, to measure the initial elastic modulus, 50% stress and rupture elongation.

[Synthesis of reaction products consisting of a compound with at least one each of the structures represented by the general formula (I) and the structures represented by the general formula (II), and a quinonediazide compound]

Synthesis Example 1

Forty seven grams of glycidyl acrylate and 55 g of 2-hydroxybenzoic acid were dissolved into 200 g of dioxane. Then, 2.7 g of tetraethylammonium bromide and 1.4 g of hydroquinone were added, and the mixture was stirred at 70° C. for 4 hours, for reaction. After completion of reaction, the reaction solution was poured into a beaker containing 500 g of water and 500 g of diethyl ether, and the entire solution in the beaker was transfused into a separating funnel. The separating funnel separated it into a water layer and an organic layer, and the solvent of the organic layer was removed by drying under reduced pressure, to obtain a compound with one each of the structures represented by the general formula (I) and the structures represented by the general formula (II).

Twenty grams of the compound and 10 g of 1,2-naphthoquinone-2-diazido-4-sulfonyl chloride were dissolved into 100 g of dioxane. Separately, 10 g of sodium carbonate was dissolved into 90 g of water, and the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 55%.

Synthesis Example 2

Twenty grams of the compound obtained in Synthesis Example 1 was dissolved into 180 g of dioxane, and 0.1 g of azobisisobutyronitrile was added. Polymerization reaction was effected in nitrogen atmosphere at 65° C. for 6 hours. After completion of reaction, the reaction solution was poured into a beaker containing 1800 g of methanol, to precipitate a product. The supernatant solution of the beaker was removed, and the residue was dried under reduced pressure, to obtain the intended compound. The esterification degree was 54%.

Synthesis Example 3

Fifty grams of the compound obtained in Synthesis Example 1, 5 g of methyl methacrylate and 10 g of hexyl methacrylate were dissolved into 250 g of dioxane, and 0.12 g of azobisisobutyronitrile was added. Polymerization reaction was effected in nitrogen atmosphere at 65° C. for 4 hours. After completion of reaction, the reaction solution was poured into a beaker containing 1000 g of methanol, to precipitate a product. The supernatant solution of the beaker was removed, and the residue was dried under reduced pressure, to obtain the intended compound. The esterification degree was 20%.

Synthesis Example 4

Sixty grams of glycerol, 185 g of epichlorohydrin, and 80 g of sodium hydroxide were dissolved into 400 g of water. The solution was stirred by a mechanical stirrer carefully not to cause bumping, and heated. Reaction was effected at the reflux temperature for 14 hours. After completion of reaction, the reaction solution was dried under reduced pressure, to remove water. After removal of water, a liquid reaction product and solid sodium chloride were precipitated. The mixture was separated by filtration under reduced pressure, to remove the solid sodium chloride.

Ninety one grams of the epoxy compound thus obtained, 152 g of 4-hydroxybenzoic acid, and 2.3 g of triethylbenzylammonium chloride were dissolved into 200 ml of dioxane, and the mixture was stirred by a mechanical stirrer, for reaction at 70° C. for 6 hours. After completion of reaction, 700 ml of diethyl ether and 500 ml of water were added, and the mixture was subjected to extraction using a separating funnel. The organic layer was dried by sodium sulfate, and sodium sulfate was removed by filtration under reduced pressure. Then, the solvent was removed by drying under reduced pressure, to obtain a compound with at least one each of the structures represented by the general formula (I) and the structures represented by the general formula (II).

Twenty grams of the compound and 20 g of 1,2-naphthoquinone-2-diazido-5-sulfonyl chloride were dissolved into 100 g of dioxane. Separately, 10 g of sodium carbonate was dissolved into 90 g of water, and the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 28%.

Synthesis Example 5

Fifty grams of glycerol, 50 g of 2-hydroxybenzaldehyde, 300 g of toluene, and 1 g of 4-benzenesulfonic acid were mixed, and the mixture was stirred by a Dean-Stark apparatus, while being heated and refluxed for 5 hours, for reaction while water and toluene were azeotropically removed. After completion of reaction, the reaction mixture was cooled to room temperature, for separation into a product and a supernatant solution (solvent). The solvent was removed by decantation, and the residue was dried under reduced pressure, to obtain a compound with one each of the structures represented by the general formula (I) and the structures represented by the general formula (II).

The compound was used and caused to react with 1,2-naphthoquinone-2-diazido-4-sulfonyl chloride as done in Synthesis Example 1, to obtain the intended compound. The esterification degree was 50%.

Synthesis Example 6

Reaction was effected as done in Synthesis Example 5, except that 1,2-naphthoquinone-2-diazido-5-sulfonic acid chloride was used instead of 1,2-naphthoquinone-2-diazido-4-sulfonic acid chloride, to obtain the intended compound. The esterification degree was 50%.

Synthesis Example 7

Reaction was effected as done in Synthesis Example 5, except that 45 g of trimethylolpropane was used instead of 50 g of glycerol, to obtain the intended compound. The esterification degree was 46%.

[Synthesis of reaction products by partially crosslinking, by a crosslinking agent, a compound with at least one each of the structures represented by the general formula (I) and the structures represented by the general formula (II), and esterifying by a quinonediazide compound]

Synthesis Example 8

Twenty grams of the compound with one each of the structures represented by the general formula (I) and the structures represented by the general formula (if) obtained in Synthesis Example 1, and 2 g of hexamethylene diisocyanate were dissolved into 100 g of dioxane, and the mixture was stirred in nitrogen atmosphere at 30° C. for 6 hours by a mechanical stirrer, for reaction.

Into the solution, 5 g of 1,2-naphthoquinone-2-diazido-5-sulfonyl chloride was dissolved. Separately, 10 g of sodium carbonate was dissolved into 90 g of water, and the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 35%.

Synthesis Example 9

Thirty grams of the compound with one each of the structures represented by the general formula (I) and the structures represented by the general formula (II) obtained in Synthesis Example 5 and 3 g of diphenylmethane dissocyanate were dissolved into 100 g of dioxane, and the mixture was stirred at 30° C. for 6 hours by a mechanical stirrer, for reaction.

Into the solution, 10 g of 1,2-naphthoquinone-2-diazido-5-sulfonyl chloride was dissolved. Separately, 10 g of sodium carbonate was dissolved into 90 g of water, and the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 50%.

[Synthesis of reaction products between a compound with at least one of the structures represented by the general formula (I), and a quinonediazide compound]

Synthesis Example 10

Twenty grams of glycerol as a compound with one of the structures represented by the general formula (I) and 10 g of 1,2-naphthoquinone-2-diazido-4-sulfonyl chloride were dissolved into 100 g of dioxane. Separately, 10 g of sodium carbonate was dissolved into 90 g of water, and the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 40%.

Synthesis Example 11

Reaction was effected as done in Synthesis Example 10, except that 17 g of trimethylolpropane was used instead of 20 g of glycerol, to obtain the intended compound. The esterification degree was 36%.

Synthesis Example 12

Twenty grams of 2-hydroxyethyl methacrylate as a compound with one of the structures represented by the general formula (I) and 10 g of 1,2-naphthoquinone-2-diazido-5-sulfonyl chloride were dissolved into 100 g of dioxane. Separately, 10 g of sodium carbonate was dissolved into 90 g of water, the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain a quinonediazido group-containing monomer.

Twenty grams of the monomer and 15 g of 2-hydroxyethyl methacrylate were dissolved into 215 of dioxane, and 0.12 g of azobisisobutyronitrile was added. Polymerization reaction was effected in nitrogen atmosphere at 65° C. for 4 hours. After completion of reaction, the reaction solution was poured into a beaker containing 1000 g of methanol, to precipitate a product. The supernatant solution of the beaker was removed, and the residue was dried under reduced pressure, to obtain the intended compound. The esterification degree was 42%.

[Synthesis of reaction products between a compound with at least one of the structures represented by the general formula (II), and a quinonediazide compound]

Synthesis Example 13

Twenty five grams of 4-hydroxystyrene as a compound with one of the structures represented by the general formula (II) and 8 g of 1,2-benzoquinone-2-diazido-4-sulfonyl chloride were dissolved into 100 g of dioxane. Separately, 10 g of sodium carbonate was dissolved into 90 g of water, and the 10 wt % sodium carbonate solution was added dropwise into said dioxane solution, taking 10 minutes (in this case the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain a quinonediazido group-containing monomer.

Twenty grams of the monomer and 15 g of 2-hydroxystyrene were dissolved into 215 g of dioxane, and 0.12 g of azobisisobutyronitrile was added. Polymerization reaction was effected in nitrogen atmosphere at 65° C. for 4 hours. After completion of reaction, the reaction solution was poured into a beaker containing 1000 g of methanol, to precipitate a product. The supernatant solution of the beaker was removed, and the residue was dried under reduced pressure, to obtain the intended compound. The esterification degree was 42%.

Synthesis Example 14

Twenty five grams of phenol novolak formaldehyde novolak resin ("Sumica Resin" PR50622 produced by Sumitomo Durez) as a compound with one of the structures represented by the general formula (II) and 25 g of 1,2-naphthoquinone-2-diazido-5-sulfonyl chloride were dissolved into 100 g of dioxane. Separately, 10 g of sodium carbonate was dissolved into 90 g of water, and the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 33%.

[Synthesis of reaction products by partially crosslinking, by a crosslinking agent, a compound with at least one of the structures represented by the general formula (I), and esterifying by a quinonediazide compound]

Synthesis Example 15

Twenty grams of glycerol as a compound with one of the structures represented by the general formula (I) and 3 g of diphenylmethane diisocyanate were dissolved into 100 g of dioxane, and the solution was stirred at 30° C. for 6 hours by a mechanical stirrer, for reaction.

Into the solution, 10 g of 1,2-naphthoquinone-2-diazido-5-sulfonyl chloride was dissolved. Separately, 10 g of sodium carbonate was dissolved into 90 g of water, and the 10 wt % sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 37%.

Synthesis Example 16

Reaction was effected as done in Synthesis Example 15, except that 17 g of trimethylolpropane was used instead of 20 g of glycerol, to obtain the intended compound. The esterification degree was 33%.

[Synthesis of reaction products by partially crosslinking, by a crosslinking agent, a compound with at least one of the structures represented by the general formula (II), and esterifying by a quinonediazide compound]

Synthesis Example 17

Twenty five grams of 4-hydroxystyrene as a compound with one of the structures represented by the general formula (II) and 4 g of hexamethylene diisocyanate were dissolved into 100 g of dioxane, and the solution was stirred at 30° C. for 6 hours by a mechanical stirrer, for reaction.

Into the solution, 10 g of 1,2-naphthoquinone-2-diazido-5-sulfonyl chloride was dissolved. Separately, 10 g of sodium carbonate was dissolved into 90 g of water, and the 10 wt% sodium carbonate solution was added dropwise into said dioxane solution, taking 10 minutes (in this case, the dioxane solution was stirred and kept at a temperature of 40° C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 40%.

Synthesis Example 18

Twenty five grams of phenol novolak formaldehyde novolak resin ("Sumica Resin" PR50622 produced by Sumitomo Durez) and 4 g of 2,6-tolylene diisocyanate were dissolved into 100 g of dioxane, and the solution was stirred at 30° C. for 6 hours by a mechanical stirrer for reaction.

Into the solution, 10 g of 1,2-naphthoquinone-2-diazido-4-sulfonyl chloride was dissolved. Separately, 10 g of sodium carbonate was dissolved into 90 g of water, and the 10 wt % sodium carbonate solution was added dropwise into said dioxane solution, taking 10 minutes (in this case, the dioxane solution was-stirred and kept at a temperature of 40°

C.). After completion of dropwise addition, the mixture was stirred at 40° C. for 4 hours, for reaction. After completion of reaction, the reaction solution was poured into a beaker containing 1000 g of water, to precipitate a product. The supernatant solution of the beaker was removed, and the residue was dried under reduced pressure, to obtain the intended compound. The esterification degree was 36%.

[Synthesis of a diazo resin for a primer layer]

Synthesis Example 19

Fourteen point five grams of p-diazodiphenylamine sulfate was dissolved into 40.9 g of concentrated sulfuric acid under ice cooling, and into the solution, 1.0 g of paraformaldehyde was added dropwise slowly to keep the temperature of the reaction Solution at 10° C. or lower. Then, the mixture was stirred for 2 hours tinder ice cooling. The reaction mixture was added dropwise into 500 ml of ethanol under ice cooling, for precipitation. The precipitate was secured by filtration, washed by ethanol and dissolved into 100 ml of water. Into the solution, a concentrated cold aqueous solution containing 6.8 g of zinc chloride was added. The precipitate formed was secured by filtration, washed by ethanol, and dissolved into 150 ml of water. Into the solution, a concentrated cold aqueous solution with 8 g of ammonium hexafluorophosphate dissolved was added. The formed precipitate was secured by filtration, washed by water and dried for a whole day and night at 30° C., to obtain a diazo resin.

EXAMPLE 1

A 0.3 mm thick aluminum sheet (produced by Sumitomo Metal Industries, Ltd.) was coated with the following primer composition, using a bar coater, and thermally treated at 200° C. for 2 minutes, to form a 5 μm primer layer.

| | | |
|---|---|---|
| (a) | Polyurethane resin "Sanprene LQ-T1331" (produced by Sanyo Chemical Industries, Ltd.,) (glass transition point Tg: −37° C.) | 100 parts by weight |
| (b) | Block isocyanate "Takenate B830" (produced by Takeda Chemical Industries, Ltd.) | 20 parts by weight |
| (c) | Epoxy phenol urea resin "SJ9372" (produced by Kansai Paint Co., Ltd.) | 8 parts by weight |
| (d) | Titanium oxide | 10 parts by weight |
| (e) | Dibutyltin diacetate | 0.5 part by weight |
| (f) | Mono(2-methacryloyloxyethyl) acid phosphate | 1 part by weight |
| (g) | Dimethyl formamide | 725 parts by weight |

In succession, the primer layer was coated with the following photosensitive layer composition, using a bar coater, and dried in 110° C. hot air for 1 minute, to form a 1.5 μm thick photosensitive layer.

| | | |
|---|---|---|
| (a) | The compound obtained in Synthesis Example 1 | 72 parts by weight |
| (b) | 4,4'-diphenylmethane dissocyanate | 20 parts by weight |
| (c) | Polyurethane resin "Miractlan" P22S (produced by Nippon Miractlan K.K.) (glass transition point Tg: −40° C.) | 30 parts by weight |
| (d) | 1,2-naphthoquinone-2-diazido-4-sulfonic acid | 2 parts by weight |
| (e) | Dibutyltin diacetate | 0.2 part by weight |
| (f) | 4-toluenesulfonic acid | 0.8 part by weight |
| (g) | Tetrahydrofuran | 800 parts by weight |

Subsequently, the photosensitive layer was rotation-coated with the following silicone rubber composition and hardened by wet heat at 115° C. at a dew point of 30° C. for 3.5 minutes, to form a 2 μm ink repellent layer (silicone rubber layer)

| | | |
|---|---|---|
| (a) | Polydimethylsiloxane (about 25,000 in molecular weight, with hydroxyl groups at the ends) | 100 parts by weight |
| (b) | Vinyltri(methylethylketoxime)silane | 10 parts by weight |
| (c) | "Isopar E" (produced by Exone Kagaku K.K.) | 1400 parts by weight |

The laminate obtained as above was further laminated with a 10 μm thick polypropylene film "Torayphane" (produced by Toray Industries, Inc.) using a calender roll as a protective layer, to obtain a water-less lithographic raw plate.

The raw plate was fully exposed using a metal halide lamp (Idolfin 2000 produced by Iwasaki Electric Co., Ltd.) at an illuminance of 11 mW/cm$^2$ identified by a UV meter (Light Measure type UV-402A produced by Oak Seisakusho).

A negative film with a dot image of 150 lines/inch was brought into vacuum contact with the raw plate thus obtained, and said metal halide lamp was used for exposure at a distance of 1 m for 60 seconds.

From the exposed plate, "Torayphane" was removed, and the plate was coated on the surface, using a brush, with a treating solution consisting of "Isopar H", diethylene glycol dimethyl ether, ethyl cellosolve and N-methyldiethanolamine (=87:7:3:3 as a ratio by weight). After completion of treatment for 1 minute, the treating solution deposited on the plate surface was removed by a rubber squeegee, and a developing solution consisting of water, butylcarbitol, 2-ethylbutyric acid and Crystal Violet (=70:30:2:0.2 as a ratio by weight) was poured on to the plate surface and a developing pad. The plate surface was lightly rubbed by the developing pad, to remove the silicone rubber layer in the image exposed area, for exposing the surface of the photosensitive layer. On the other hand, in the non-image area subjected to full exposure only, the silicone rubber layer remained firmly. Thus, an image accurately reproducing the negative film could be obtained.

The printing plate thus obtained was installed in an offset press (Komori Splint 4-Color Machine) and "Dry-o-color" black, cyan, magenta and yellow inks produced by Dainippon Ink & Chemicals, Inc. were used for printing on fine quality paper for a printing durability test. Even though 160,000 sheets were printed, the printed sheets were good, and the printing plate inspected after completion of printing was found to be slightly damaged.

The tensile properties of the water-less lithographic raw plate used in this example are shown in Table 2.

EXAMPLE 2

A 0.24 mm thick aluminum plate finished to look like grains on the surface was coated with the following primer composition using a whirler at 50° C., and dried at 80° C. for 4 minutes, to form a primer layer.

| | | |
|---|---|---|
| (a) | The diazo resin synthesized in Synthesis Example 19 | 8 parts by weight |
| (b) | Copolymer resin of 2-hydroxyethyl methacrylate and methyl methacrylate (=40:60 as a molar ratio) (Mw = 4.0 × 10$^4$) (glass transition point Tg: −40° C.) | 90 parts by weight |
| (c) | γ-methacryloxypropyltrimethoxysilane (produced by Toshiba Silicone) | 5 parts by weight |
| (d) | Zinc oxide (fine zinc dust produced by Sakai Kagaku K.K.) | 55 parts by weight |
| (e) | "KET-YELLOW 402" (yellow pigment produced by Dainippon Ink & | 12 parts by weight |

| | |
|---|---|
| Chemicals, Inc.) | |
| (f) "Nonypole" (nonionic surfactant produced by Sanyo Chemical Industries, Ltd.) | 5 parts by weight |
| (g) Methyl lactate | 700 parts by weight |
| (h) Cyclohexanone | 100 parts by weight |

The coated aluminum sheet was dried, exposed to a metal halide lamp at 400 mJ/cm$^2$, and dried at 115° C. for 5 minutes, to form a primer layer of 4.5 μm in dry thickness.

In succession, the primer layer was coated with the following photosensitive layer composition using a bar coater, and dried in 120° C. hot air for 1 minute, to form a 1.5 μm thick photosensitive layer

| | |
|---|---|
| (a) The compound synthesized in Synthesis Example 2 | 55 parts by weight |
| (b) Trimethylolpropane triglycidyl ether | 30 parts by weight |
| (c) Polyurethane "Sanprene" C-800B-40 (produced by Sanyo Chemical Industries, Ltd.) (glass transition point Tg: −35° C.) | 20 parts by weight |
| (d) 1,2-napthoquinone-2-diazido-5-sulfonic acid | 2.2 parts by weight |
| (e) Phosphoric acid | 0.8 part by weight |
| (f) 4,4'-diethylaminobenzophenone | 2 parts by weight |
| (g) Tetrahydrofuran | 790 parts by weight |

Subsequently, the photosensitive layer was rotation-coated with the following silicone rubber composition in dry nitrogen current, and hardened by wet heat at 115° C. at a dew point of 30° C. for 3.5 minutes, to form a 2.3 μm ink repellent layer (silicone rubber layer).

| | |
|---|---|
| (a) Polydimethylsiloxane (about 35,000 in molecular weight, with hydroxyl groups at the ends) | 100 parts by weight |
| (b) Ethyltriacetoxysilane | 12 parts by weight |
| (c) Dibutyltin diacetate | 0.1 part by weight |
| (d) "Isopar G" (produced by Exone Kagaku K.K.) | 1200 parts by weight |

The laminate obtained as above was further laminated with an 8 μm thick polyester film treated to be mat on one side "Lumilar" (produced by Toray Industries, Inc.) using a calender roll, as a protective layer, to obtain a water-less lithographic raw plate.

The raw plate was fully exposed using a metal halide lamp (Idolfin 2000 produced by Iwasaki Electric Co., Ltd.) at an illuminance of 11 mW/cm$^2$ identified by a UV meter (Light Measure type UV-402A produced by Oak Seisakusho) for 6 seconds.

A negative film with a dot image of 150 lines/inch was brought into vacuum contact with the raw plate thus obtained, and said metal halide lamp was used for exposure at a distance of 1 m for 60 seconds.

From the exposed plate, "Lumilar" was removed, and the plate was developed using TWL 1160 (water-less lithographic printing plate processor produced by Toray Industries, Inc.) at room temperature (25° C.) at 80% humidity. In this case, the following solution was used as a pre-treating solution.

| | |
|---|---|
| (a) Diethylene glycol | 80 parts by weight |
| (b) Diglycolamine | 14 parts by weight |
| (c) Water | 6 parts by weight |

Furthermore water was used as the developing solution. As a dyeing solution, the following solution was used.

| | |
|---|---|
| (a) Ethylcarbitol | 18 parts by weight |
| (b) Water | 79.9 parts by weight |
| (c) Crystal Violet | 0.1 part by weight |
| (d) 2-ethylhexanoic acid | 2 parts by weight |

The printing plate delivered from the processor was observed, and the silicone rubber layer was found to be removed in the area exposed to the image, to expose the surface of the photosensitive layer. On the other hand, the non-image area subjected to full exposure only had the silicone rubber layer remaining firmly, to show the image accurately reproduced from the negative film.

The printing plate obtained was installed in an offset press (Komori Splint 4-Color Machine), and a printing durability test was performed as done in Example 1. After 160,000 sheets were printed, the printed sheets were good, and the printing plate inspected after completion of printing was found to be slightly damaged.

The tensile properties of the water-less lithographic raw plate used in this example are shown in Table 2.

EXAMPLE 3

A 0.24 mm thick aluminum sheet was immersed in 3% sodium hydroxide aqueous solution, to be greased, washed by water, anodically oxidized in 32% sulfuric acid aqueous solution at 30° C. at 5 A/dm$^2$ for 10 seconds, washed by water, immersed in 2% sodium metasilicate aqueous solution at 85° C. for 37 seconds, furthermore immersed in 90° C. water (pH 8.5) for 25 seconds, washed by water and dried, to obtain a substrate.

The substrate thus obtained was coated with the following primer composition using a slit die coater, and thermally treated in 220° C. hot air for 3 minutes, to form a 5 μm primer layer.

| | |
|---|---|
| (a) Polyurethane resin "Sanprene LQ-T1331" produced by Sanyo Chemical Industries, Ltd.) (glass transition point Tg: −37° C.) | 100 parts by weight |
| (b) Block isocyanate "Takenate B830" (produced by Takeda Chemical Industries, Ltd.) | 20 parts by weight |
| (c) Epoxy phenol urea resin "SJ9372" (produced by Kansai Paint Co., Ltd.) | 8 parts by weight |
| (d) Titanium oxide | 10 parts by weight |
| (e) Dibutyltin diacetate | 0.5 part by weight |
| (f) Mono(2-methacryloyloxyethyl) acid phosphate | 1 part by weight |
| (g) Dimethyl formamide | 700 parts by weight |
| (h) Tetrahydrofuran | 50 parts by weight |

The following sensitizing solutions (A) & (B) were mixed immediately before coating, and said primer layer was coated with the mixture using a slit die coater, and dried in 115° C. hot air for 1 minute, to form a 1.5 μm thick photosensitive layer.

Sensitizing solution (A)

| | |
|---|---|
| (a) The compound synthesized in Synthetic Example 3 | 80 parts by weight |
| (b) Polyurethane "Sanprene" C-800B-40 (produced by Sanyo Chemical Industries, Ltd.) (glass transition point Tg: −35° C.) | 22 parts by weight |
| (c) 1,2-naphthoquinone-2-diazido-4-sulfonic acid | 2 parts by weight |

-continued

| | | |
|---|---|---|
| (d) Dibutyltin diacetate | 0.2 | parts by weight |
| (e) Benzenesulfonic acid | 0.8 | parts by weight |
| (f) Tetrahydrofuran | 700 | parts by weight |

Sensitizing solution (B)

| | | |
|---|---|---|
| (a) Isophorone diisocyanate | 20 | parts by weight |
| (b) Tetrahydrofuran | 100 | parts by weight |

Subsequently the photosensitive layer was coated with the following silicone rubber solution using a slit die coater, and heated at 120° C. for 4 minutes, to be hardened, to form a 1.8 µm ink repellent layer (silicone rubber layer).

| | | |
|---|---|---|
| (a) Polydimethylsiloxane with vinyl groups at both the ends (polymerization degree about 700) | 100 | parts by weight |
| (b) $(CH_3)_3Si-O-(Si(CH_3)_2-O)_{30}$-$(SiH(CH_3)-O)_{10}$-$Si(CH_3)_3$ | 10 | parts by weight |
| (c) Chloroplatinic acid/methylvinyl cyclics complex | 0.1 | part by weight |
| (d) Acetylacetone alcohol | 0.1 | part by weight |
| (e) Polydimethyisiloxane (polymerization degree about 8000) | 10 | parts by weight |
| (f) "Isopar E" (produced by Exone Kagaku K. K.) | 1000 | parts by weight |

The laminate obtained as above was further laminated with an 8 µm thick polyester film "Lumilar" (produced by Toray Industries, Inc) using a calender roller as a protective layer, to obtain a water-less lithographic raw plate.

The raw plate was treated as done in Example 2, exposed to a dot image of 150 lines/inch using a negative film, and developed as done in Example 2.

The printing plate obtained was tested as to printing durability as done in Examples 1 and 2, and found to have a printing durability of 160,000 sheets.

The tensile properties of the water-less lithographic raw plate used in this example are shown in Table 2.

EXAMPLE 4

A water-less lithographic raw plate was obtained as done in Example 1, except that the compound synthesized in Synthesis Example 4 was used as an ingredient of the photosensitive layer instead of the compound synthesized in Synthesis Example 1.

The water-less lithographic raw plate obtained was exposed and developed as done in Example 1, and furthermore tested as to printing durability as done in Example 1, being found to have a printing durability of 160,000 sheets.

The tensile properties of the water-less lithographic raw plate used in this example are shown in Table 2.

EXAMPLE 5

A water-less lithographic raw plate was obtained as done in Example 2, except that the compound synthesized in Synthesis Example 5 was used as an ingredient of the photosensitive layer instead of the compound synthesized in Synthesis Example 2.

The water-less lithographic raw plate obtained was exposed and developed as done in Example 2, and furthermore tested as to printing durability as done in Example 2, being found to have a printing durability of 160,000 sheets.

The tensile properties of the water-less lithographic raw plate used in this example are shown in Table 2.

EXAMPLE 6

A water-less lithographic raw plate was obtained as done in Example 3, except that the compound synthesized in Synthesis Example 6 was used as an ingredient of the photosensitive layer instead of the compound synthesized in Synthesis Example 3.

The water-less lithographic raw plate obtained was exposed and developed as done in Example 3, and furthermore tested as to printing durability as done in Example 3, being found to have a printing durability of 160,000 sheets.

The tensile properties of the water-less lithographic raw plate used in this example are shown in Table 2.

EXAMPLE 7

A water-less lithographic raw plate was obtained as done in Example 1, except that the compound synthesized in Synthesis Example 7 was used as an ingredient of the photosensitive layer instead of the compound synthesized in Synthesis Example 1.

The water-less lithographic raw plate obtained was exposed and developed as done in Example 1, and furthermore tested as to printing durability as done in Example 1, being found to have a printing durability of 160,000 sheets.

The tensile properties of the water-less lithographic raw plate used in this example are shown in Table 2.

EXAMPLE 8

A water-less lithographic raw plate was obtained as done in Example 2, except that the compound synthesized in Synthesis Example 8 was used as an ingredient of the photosensitive layer instead of the compound synthesized in Synthesis Example 2.

The water-less lithographic raw plate obtained was exposed and developed as done in Example 2, and furthermore tested as to printing durability as done in Example 2, being found to have a printing durability of 150,000 sheets.

The tensile properties of the water-less lithographic raw plate used in this example are shown in Table 2.

EXAMPLE 9

A water-less lithographic raw plate was obtained as done in Example 3, except that the compound synthesized in Synthesis Example 9 was used as an ingredient of the photosensitive layer instead of the compound synthesized in Synthesis Example 3.

The water-less lithographic raw plate obtained was exposed and developed as done in Example 3, and furthermore tested as to printing durability as done in Example 3, being found to have a printing durability of 150,000 sheets.

The tensile properties of the water-less lithographic raw plate used in this example are shown in Table 2.

EXAMPLE 10

A water-less lithographic raw plate was obtained as done in Example 1, except that the following were used as the ingredient (a) of the photosensitive layer instead of 72 parts by weight of the compound synthesized in Synthesis Example 1.

| | |
|---|---|
| (a-1) The compound synthesized in Synthesis Example 10 | 40 parts by weight |
| (a-2) The compound synthesized in Synthesis Example 13 | 32 parts by weight |

The water-less lithographic raw plate obtained was exposed and developed as done in Example 1, and furthermore tested as to printing durability as done in Example 1, being found to have a printing durability of 150,000 sheets.

The tensile properties of the water-less lithographic raw plate used in this example are shown in Table 2.

EXAMPLE 11

A water-less lithographic raw plate was obtained as done in Example 2, except that the following were used as the ingredient (a) of the photosensitive layer instead of 55 parts by weight of the compound synthesized in Synthesis Example 2.

| | |
|---|---|
| (a-1) The compound synthesized in Synthesis Example 11 | 33 parts by weight |
| (a-2) The compound synthesized in Synthesis Example 14 | 22 parts by weight |

The water-less lithographic raw plate obtained was exposed and developed as done in Example 2, and furthermore tested as to printing durability as done in Example 2, being found to have a printing durability of 150,000 sheets.

The tensile properties of the water-less lithographic raw plate used in this example are shown in Table 2.

EXAMPLE 12

A water-less lithographic raw plate was obtained as done in Example 3, except that the following were used as the ingredient (a) of the photosensitive layer instead of 80 parts by weight of the compound synthesized in Synthesis Example 3.

| | |
|---|---|
| (a-1) The compound synthesized in Synthesis Example 12 | 33 parts by weight |
| (a-2) The compound synthesized in Synthesis Example 17 | 22 parts by weight |

The water-less lithographic raw plate obtained was exposed and developed as done in Example 3, and furthermore tested as to printing durability as done in Example 3, being found to have a printing durability of 150,000 sheets.

The tensile properties of the water-less lithographic raw plate used in this example are shown in Table 2.

EXAMPLE 13

A water-less lithographic raw plate was obtained as done in Example 2, except that the following were used as the ingredient (a) of the photosensitive layer instead of 55 parts by weight of the compound synthesized in Synthesis Example 2.

| | |
|---|---|
| (a-1) The compound synthesized in Synthesis Example 15 | 32 parts by weight |
| (a-2) The compound synthesized in Synthesis Example 18 | 23 parts by weight |

The water-less lithographic raw plate obtained was exposed and developed as done in Example 2, and furthermore tested as to printing durability as done in Example 2, being found to have a printing durability of 150,000 sheets.

The tensile properties of the water-less lithographic raw plate used in this example are shown in Table 2.

EXAMPLE 14

A water-less lithographic raw plate was obtained as done in Example 3, except that the following were used as the ingredient (a) in the sensitizing solution (A) of the photosensitive layer instead of 80 parts by weight of the compound synthesized in Synthesis Example 3.

| | |
|---|---|
| (a-1) The compound synthesized in Synthesis Example 16 | 55 parts by weight |
| (a-2) The compound synthesized in Synthesis Example 14 | 25 parts by weight |

The water-less lithographic raw plate obtained was exposed and developed as done in Example 3, and furthermore tested as to printing durability as done in Example 3, being found to have a printing durability of 150,000 sheets.

The tensile properties of the water-less lithographic raw plate used in this example are shown in Table 2.

Comparative Examples 1 to 3

Negative type water-less lithographic raw plates different in the composition of the photosensitive layer were prepared as done in Example 1, except that the kinds and amounts of the ingredients (a), (b) and (c) of the photosensitive layer were changed as shown in Table 1. The raw plates were treated as done in Example 2, and exposed to a dot image of 150 lines/inch using a negative film, then being developed and tested as to printing durability as done in Example 2. The tensile properties, image reproducibilities and printing durabilities of the photosensitive layers are shown in Table 2.

In Comparative Example 1, since the binder polymer content of the photosensitive layer was as small as 8.2 wt %, satisfactory tensile properties could not be exhibited, and the photosensitive layer was very hard and fragile. In offset printing, the non-image area was soiled after printing 60,000 sheets. The plate was removed from the printing machine and the soiled portions were observed by a microscope, to confirm that the photosensitive layer itself was ruptured, and that the silicone rubber layer was ruptured at the corresponding portions and peeled.

In Comparative Example 2, since the binder polymer content of the photosensitive layer was as large as 86.5 wt %, the photosensitive layer was physically too soft. Furthermore, since the photosensitive ingredient content was too small, satisfactory image reproducibility and developability could not be obtained. The plate could not reproduce the image even after exposure and development, that is, did not allow development. So, the plate could not be tested as to printing durability.

In Comparative Example 3, this problem was intended to be solved by increasing the amount of the photosensitive groups in the photosensitive ingredient, i.e., by keeping the esterification degree of the partially esterified product of 1,2-naphthoquinone-2-diazido-5-sulfonyl chloride and phenol formaldehyde novolak resin at as high as 70%. Compared to Comparative Example 2, the image reproducibility was somewhat improved, but since the binder polymer content of the photosensitive layer was too large, the photosensitive layer could not exhibit satisfactory physical properties. Furthermore, since the amount of the photosensitive ingredient itself was small, the bonding strength between the ink repellent layer and the photosensitive layer was low, and only a printing durability as low as 80,000 sheets could be obtained.

EXAMPLES 15 through 18

Negative type water-less lithographic raw plates different in the composition and tensile properties of the photosensitive layer were prepared as done in Example 1, except that the kinds and amounts of the ingredients (a) and (c) of the photosensitive layer were changed as shown in Table 3. The raw plates were treated as done in Example 2 and exposed to a dot image of 150 lines/inch using a negative film, then being developed as done in Example 2, to obtain printing plates.

The printing plates obtained were installed in an offset press (Komori Splint 4-Color Machine), and "Dry-o-color" black, cyan, magenta and yellow inks produced by Dainippon Ink & Chemicals, Inc. were used to print on fine quality paper for printing durability tests. Table 2 shows the tensile properties of the photosensitive layers and the image reproducibilities and printing durabilities of the printing plates.

EXAMPLES 19 through 27

Negative type water-less lithographic raw plates different in binder polymer were prepared as done in Example 1, except that the kinds and amounts of the ingredients (a) and (c) of the photosensitive layer were changed as shown in Table 4. The raw plates were treated as done in Example 2, and exposed to an image and developed similarly, to obtain printing plates. The printing plates obtained were similarly tested as to printing durability. Table 5 shows the tensile properties of the photosensitive layers and the image reproducibilities and printing durabilities of the printing plates.

TABLE 1

| Comparative example 1 | |
|---|---|
| (a) Partially esterified product of 1,2-naphthoquinone-2-diazido-5-sulfonyl chloride and phenol formaldehyde novolak resin ("Sumilite Resin" PR50622 produced by Sumitomo Durez) (esterification degree by elementary analysis, 18%) | 90 parts by weight |
| (b) 4,4'-diphenylmethane diisocyanate | 21 parts by weight |
| (c) Polyurethane "Miractlan" P22S (produced by Nippon Miractlan K.K.) (glass transition point Tg: −40° C.) | 10 parts by weight |
| Comparative example 2 | |
| (a) Partially esterified product of 1,2-naphthoquinone-2-diazido-5-sulfonyl chloride and phenol formaldehyde novolak resin ("Sumilite Resin" PR50622 produced by Sumitomo Durez) (esterification degree by elementary analysis, 35%) | 10 parts by weight |
| 4,4'-diphenylmethane diisocyanate | 3 parts by weight |
| (c) Polyurethane resin "Miractlan" P22S (produced by Nippon Miractlan K.K.) (glass transition point Tg: −40° C.) | 90 parts by weight |
| Comparative example 3 | |
| (a) Partially esterified product of 1,2-naphthoquinone-2-diazido-5-sulfonyl chloride and phenol formaldehyde novolak resin ("Sumilite Resin" PR50622 produced by Sumitomo Durez) (esterification degree by elementary analysis, 70%) | 10 parts by weight |
| (b) 4,4'-diphenylmethane diisocyanate | 3 parts by weight |
| (c) Polyurethane resin "Miractlan" P22S (produced by Nippon Miractlan K.K.) (glass transition point Tg: −40°C.) | 90 parts by weight |

TABLE 2

| | Printing durability (10,000 sheets) | Image reproducibility (%) | Physical properties of photosensitive layer | | | | | | Physical properties of primer layer | | | | | | Physical properties of primer layer plus photosensitive layer | | | | | | Physical properties of silicone rubber layer | | |
|---|---|---|---|---|---|---|---|---|---|---|---|---|---|---|---|---|---|---|---|---|---|---|---|
| | | | Initial elastic modulus (kgf/mm²) | | 10% stress (kgf/mm²) | | Rupture elongation (%) | | Initial elastic modulus (kgf/mm²) | 10% stress (kgf/mm²) | Rupture elongation (%) | | | Initial elastic modulus (kgf/mm²) | | 10% stress (kgf/mm²) | | Rupture elongation (%) | | Initial elastic modulus (kgf/mm²) | 50% stress (kgf/mm²) | Rupture elongation (%) |
| | | | Before exp. | After exp. | Before exp. | After exp. | Before exp. | After exp. | | | | Before exp. | After exp. | Before exp. | After exp. | Before exp. | After exp. | | | | |
| Ex. 1 | 16 | 2-98 | 18 | 17 | 0.73 | 0.72 | 69 | 70 | 5 | 0.30 | 655 | 10 | 10 | 0.72 | 0.72 | 78 | 78 | 0.04 | 0.015 | 430 |
| Ex. 2 | 16 | 2-98 | 17 | 17 | 0.75 | 0.74 | 72 | 73 | 19 | 0.68 | 95 | 18 | 17 | 0.69 | 0.69 | 74 | 74 | 0.04 | 0.014 | 421 |
| Ex. 3 | 16 | 2-98 | 18 | 17 | 0.72 | 0.72 | 74 | 74 | 5 | 0.30 | 655 | 15 | 15 | 0.71 | 0.70 | 79 | 80 | 0.05 | 0.016 | 380 |
| Ex. 4 | 16 | 2-98 | 18 | 18 | 0.69 | 0.70 | 74 | 74 | 5 | 0.30 | 655 | 10 | 11 | 0.68 | 0.68 | 77 | 77 | 0.04 | 0.015 | 430 |
| Ex. 5 | 16 | 2-98 | 18 | 17 | 0.71 | 0.72 | 75 | 75 | 19 | 0.68 | 95 | 17 | 16 | 0.70 | 0.69 | 78 | 78 | 0.05 | 0.014 | 421 |
| Ex. 6 | 16 | 2-98 | 19 | 18 | 0.73 | 0.72 | 71 | 71 | 5 | 0.30 | 655 | 13 | 13 | 0.72 | 0.72 | 74 | 75 | 0.05 | 0.016 | 380 |
| Ex. 7 | 16 | 2-98 | 18 | 17 | 0.68 | 0.68 | 88 | 88 | 5 | 0.30 | 655 | 12 | 12 | 0.62 | 0.62 | 78 | 78 | 0.04 | 0.015 | 430 |
| Ex. 8 | 15 | 2-98 | 17 | 16 | 0.69 | 0.68 | 91 | 92 | 19 | 0.68 | 95 | 18 | 17 | 0.68 | 0.67 | 77 | 77 | 0.04 | 0.014 | 421 |
| Ex. 9 | 15 | 2-98 | 18 | 17 | 0.69 | 0.68 | 91 | 91 | 5 | 0.30 | 655 | 14 | 14 | 0.65 | 0.65 | 76 | 77 | 0.05 | 0.016 | 380 |
| Ex. 10 | 15 | 2-98 | 28 | 26 | 1.14 | 1.14 | 36 | 36 | 5 | 0.30 | 655 | 21 | 20 | 0.95 | 0.95 | 61 | 61 | 0.04 | 0.015 | 430 |
| Ex. 11 | 15 | 2-98 | 27 | 26 | 1.15 | 1.14 | 38 | 38 | 19 | 0.68 | 95 | 24 | 23 | 0.92 | 0.93 | 60 | 61 | 0.04 | 0.014 | 421 |
| Ex. 12 | 15 | 2-98 | 29 | 28 | 1.17 | 1.15 | 35 | 35 | 5 | 0.30 | 655 | 21 | 21 | 0.88 | 0.87 | 67 | 67 | 0.05 | 0.016 | 380 |
| Ex. 13 | 15 | 2-98 | 26 | 25 | 1.12 | 1.12 | 41 | 42 | 19 | 0.68 | 95 | 24 | 23 | 0.94 | 0.94 | 60 | 60 | 0.04 | 0.014 | 421 |
| Ex. 14 | 15 | 2-98 | 30 | 29 | 1.17 | 1.16 | 34 | 34 | 5 | 0.30 | 655 | 22 | 22 | 0.88 | 0.87 | 62 | 63 | 0.05 | 0.016 | 380 |
| Comp. ex. 1 | 6 | 2-98 | 59 | 58 | — | — | 5 | 6 | 5 | 0.30 | 655 | 55 | 55 | — | — | 9 | 9 | 0.04 | 0.015 | 430 |
| Comp. ex. 2 | * | —* | 3 | 3 | 0.03 | 0.03 | 851 | 852 | 5 | 0.30 | 655 | 4 | 4 | 0.15 | 0.15 | 763 | 765 | 0.04 | 0.015 | 430 |
| Comp. ex. 3 | 8 | 15-85 | 3 | 3 | 0.03 | 0.03 | 875 | 876 | 5 | 0.30 | 655 | 4 | 4 | 0.15 | 0.15 | 788 | 789 | 0.04 | 0.015 | 430 |
| Ex. 15 | 23 | 2-98 | 7 | 7 | 0.68 | 0.67 | 88 | 89 | 5 | 0.30 | 655 | 6 | 6 | 0.62 | 0.62 | 94 | 95 | 0.04 | 0.015 | 430 |
| Ex. 16 | 24 | 2-98 | 8 | 8 | 0.69 | 0.68 | 91 | 93 | 5 | 0.30 | 655 | 6 | 6 | 0.65 | 0.64 | 100 | 102 | 0.04 | 0.015 | 430 |
| Ex. 17 | 24 | 2-98 | 8 | 8 | 0.69 | 0.68 | 91 | 91 | 5 | 0.30 | 655 | 6 | 6 | 0.66 | 0.66 | 102 | 103 | 0.04 | 0.015 | 430 |
| Ex. 18 | 23 | 2-98 | 7 | 7 | 0.70 | 0.69 | 89 | 90 | 5 | 0.30 | 655 | 6 | 6 | 0.69 | 0.68 | 97 | 98 | 0.04 | 0.015 | 430 |

*Printing durability test could not be performed since development could not be effected.
**Image could not be reproduced even after exposure and development (development could not be effected).

TABLE 3

Example 15

| | | |
|---|---|---|
| (a) | The compound synthesized in Synthesis Example 2 | 50 parts by weight |
| (c) | Polyurethane resin "Miractlan" P22S (produced by Nippon Miractlan K.K.) (glass transition point Tg: −40° C.) | 50 parts by weight |

Example 16

| | | |
|---|---|---|
| (a) | The compound synthesized in Synthesis Example 5 | 50 parts by weight |
| (c) | Polyurethane resin "Miractlan" P22S (produced by Nippon Miractlan K.K.) (glass transition point Tg: −40° C.) | 50 parts by weight |

Example 17

| | | |
|---|---|---|
| (a) | The compound synthesized in Synthesis Example 6 | 50 parts by weight |
| (c) | Polyurethane resin "Miractlan" P22S (produced by Nippon Miractlan K.K.) (glass transition point Tg: −40° C.) | 50 parts by weight |

Example 18

| | | |
|---|---|---|
| (a) | The compound synthesized in Synthesis Example 7 | 50 parts by weight |
| (c) | Polyurethane resin "Miractlan" P22S (produced by Nippon Miractlan K.K.) (glass transition point Tg: −40° C.) | 50 parts by weight |

TABLE 4

Example 19

| | | |
|---|---|---|
| (a) | The compound synthesized in Synthesis Example 6 | 60 parts by weight |
| (c) | Polyester consisting of ethylene glycol and adipic acid (glass transition point Tg: −50° C.) | 40 parts by weight |

Eample 20

| | | |
|---|---|---|
| (a) | The same photosensitive ingredient as that of Example 19 | 65 parts by weight |
| (c) | Unvulcanized rubber "Nipol" LX110 (SBR latex produced by Nippon Zeon Co., Ltd., 40.5% in solid content) (glass transition point Tg of solid: −60° C.) | 35 parts by weight (solid contents) |

Eample 21

| | | |
|---|---|---|
| (a) | The same photosensitive ingredient as that of Example 19 | 50 parts by weight |
| (c) | Polyurethane consisting of a polyester diol (consisting of adipic acid, 1,6-hexanediol and neopentyl glycol) and isophorone diisocyanate (= 70:30:25:60) (glass transition point Tg: −40° C.) | 50 parts by weight |

Eample 22

| | | |
|---|---|---|
| (a) | The same photosensitive ingredient as that of Example 19 | 65 parts by weight |
| (c) | Poly(2-methylpropene) (glass transition point Tg: −40° C.) | 35 parts by weight |

Eample 23

| | | |
|---|---|---|
| (a) | The same photosensitive ingredient as that of Example 19 | 70 parts by weight |
| (c) | Poly(decyl methacrylate) (glass transition point Tg: −70° C.) | 30 parts by weight |

Eample 24

| | | |
|---|---|---|
| (a) | The same photosensitive ingredient as that of Example 19 | 70 parts by weight |
| (c) | Polypropylene oxide (glass transition point Tg: −75° C). | 30 parts by weight |

Eample 25

| | | |
|---|---|---|
| (a) | The same photosensitive ingredient as that of Example 19 | 50 parts by weight |
| (c) | Copolymerized polyamide consisting of ε-caprolactam, an equimolar salt of hexamethylenediamine and adipic acid, and an equimolar salt of α,ω-diaminopropylpolyoxyethylene (number average molecular weight: 1000) and adipic acid (= 20:20:60) (Number average molecular weight: 33000) (glass transition point Tg: −45° C.) | 50 parts by weight |

TABLE 4-continued

Eample 26

(a) The same photosensitive ingredient as that of Example 19    60 parts by weight
(c) Poly(4-octylstyrene) (glass transition point Tg: −45° C.)    40 parts by weight Eample 27

(a) The same photosensitive ingredient as that of Example 19    65 parts by weight
(c) Isoprene rubber latex "LIR-700" (Isoprene rubber latex produced by Kuraray Co., Ltd.) (glass transition point Tg of solid: −70° C.)    35 parts by weight (solid contents)

TABLE 5

| | Printing durability (10,000 sheets) | Image reproducibility (%) | Physical properties of photosensitive layer | | | | | | Physical properties of primer layer | | | | Physical properties of primer layer plus photosensitive layer | | | | | | Physical properties of silicone rubber layer | | |
|---|---|---|---|---|---|---|---|---|---|---|---|---|---|---|---|---|---|---|---|---|---|
| | | | Initial elastic modulus (kgf/mm²) | | 10% stress (kgf/mm²) | | Rupture elongation (%) | | Initial elastic modulus (kgf/mm²) | 10% stress (kgf/mm²) | Rupture elongation (%) | | Initial elastic modulus (kgf/mm²) | | 10% stress (kgf/mm²) | | Rupture elongation (%) | | Initial elastic modulus (kgf/mm²) | 50% stress (kgf/mm²) | Rupture elongation (%) |
| | | | Before exp. | After exp. | Before exp. | After exp. | Before exp. | After exp. | | | | | Before exp. | After exp. | Before exp. | After exp. | Before exp. | After exp. | | | |
| Ex. 19 | 21 | 2–98 | 14 | 13 | 0.74 | 0.73 | 70 | 70 | 5 | 0.30 | 655 | | 11 | 11 | 0.72 | 0.72 | 76 | 77 | 0.04 | 0.015 | 430 |
| Ex. 20 | 23 | 2–98 | 13 | 13 | 0.69 | 0.69 | 78 | 77 | 5 | 0.30 | 655 | | 12 | 11 | 0.73 | 0.69 | 79 | 79 | 0.04 | 0.015 | 430 |
| Ex. 21 | 24 | 2–98 | 12 | 12 | 0.70 | 0.69 | 88 | 80 | 5 | 0.30 | 655 | | 10 | 10 | 0.69 | 0.68 | 98 | 101 | 0.04 | 0.015 | 430 |
| Ex. 22 | 23 | 2–98 | 15 | 14 | 0.79 | 0.78 | 75 | 74 | 5 | 0.30 | 655 | | 12 | 12 | 0.77 | 0.77 | 77 | 79 | 0.04 | 0.015 | 430 |
| Ex. 23 | 23 | 2–98 | 16 | 16 | 0.74 | 0.74 | 72 | 71 | 5 | 0.30 | 655 | | 12 | 11 | 0.74 | 0.73 | 75 | 76 | 0.04 | 0.015 | 430 |
| Ex. 24 | 22 | 2–98 | 16 | 15 | 0.72 | 0.74 | 75 | 74 | 5 | 0.30 | 655 | | 13 | 12 | 0.70 | 0.69 | 77 | 77 | 0.04 | 0.015 | 430 |
| Ex. 25 | 20 | 2–98 | 17 | 16 | 0.84 | 0.83 | 72 | 71 | 5 | 0.30 | 655 | | 14 | 13 | 0.80 | 0.78 | 75 | 776 | 0.04 | 0.015 | 430 |
| Ex. 26 | 22 | 2–98 | 17 | 17 | 0.80 | 0.80 | 74 | 74 | 5 | 0.30 | 655 | | 14 | 12 | 0.77 | 0.76 | 75 | 75 | 0.04 | 0.015 | 430 |
| Ex. 27 | 22 | 2–98 | 12 | 12 | 0.64 | 0.63 | 75 | 74 | 5 | 0.30 | 655 | | 9 | 9 | 0.61 | 0.62 | 77 | 78 | 0.04 | 0.015 | 430 |

Industrial applicability

The water-less lithographic raw plate of the present invention can provide a water-less lithographic printing plate excellent in image reproducibility and printing durability. Therefore, it can be favorably used in the newspaper web offset printing area and the commercial web offset printing area where high printing durability is required.

We claim:

1. A water-less lithographic negative raw plate which consists of a substrate, an intermediate layer comprising a photosensitive layer adjacent said substrate and an ink repellent layer wherein the intermediate layer has an initial elastic modulus before or after completion of exposure of 5–50 kg/mm$^2$ and the photosensitive layer is a reaction product of a reactant containing quinonediazide.

2. The water-less lithographic negative raw plate of claim 1, wherein the intermediate layer has a stress at 10% elongation of 0.05–3.0 kgf/mm$^2$.

3. The water-less lithographic negative raw plate of claim 1, wherein the intermediate layer has a rupture elongation of 10% or more.

4. The water-less lithographic negative raw plate of claim 1, wherein the photosensitive layer contains a residue of quinonediazide, a compound having a structure represented by the following general formula (I) and a compound having a structure represented by the following general formula (II):

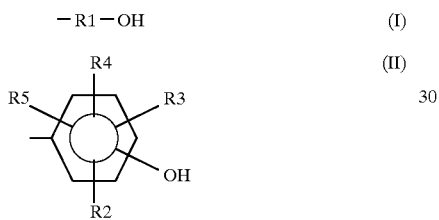

where R1 stands for at least one element selected from a group consisting of sulfur, substituted or non-substituted nitrogen, substituted or non-substituted carbon and substituted or non-substituted silicon; and R2, R3, R4 and R5 are selected from a group consisting of hydrogen, halogens, hydroxyl, nitro, amino, mercapto, cyano, sulfonyl, nitroso, substituted or non-substituted alkyl, alkoxy, amido, acyloxy, alkanoyl, formyl, carboxyl with 1 to 100 carbon atoms, substituted or non-substituted alkenyl, alkenyloxy with 2 to 100 carbon atoms, substituted or non-substituted aryl, and aryloxy with 4 to 100 carbon atoms.

5. The water-less lithographic negative raw plate of claim 1, wherein the reaction product comprises a reaction product of (A) and (B), wherein
(A) is a reaction product between quinonediazide and the compound having the structure represented by the general formula (I) and
(B) is a reaction product between quinonediazide and the compound having the structure represented by the general formula (II).

6. The water-less lithographic negative raw plate of claim 5, wherein the compound having the structures represented by the general formula (I) or (II) has at least two of the structure represented by the general formula (I) or (II).

7. The water-less lithographic negative raw plate of claim 5, wherein the compounds having the structure represented by the general formulae (I) and (II) are partially crosslinked and esterified by the quinonediazide.

8. The water-less lithographic negative raw plate of claim 5, wherein 20% or more of the skeleton of the compound of the structures represented by the general formulae (I) and (II) is formed from structure other than an aromatic ring.

9. The water-less lithographic negative raw plate of claim 5, wherein 10% or more of the skeleton of the compound of the structure represented by the general formula (I) is formed from structure other than an aromatic ring.

10. The water-less lithographic negative raw plate of claim 7, wherein the esterification degree is 5–95%.

11. The water-less, lithographic negative raw plate of claim 7, wherein the quinonediazide group in the reaction product obtained by esterifying the quinonediazide compound is at least one of the structures represented by the following formulae (III) to (V):

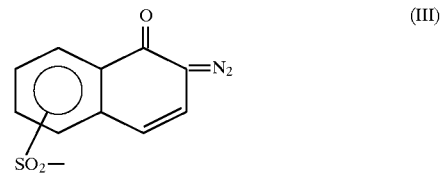

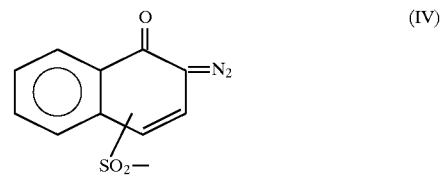

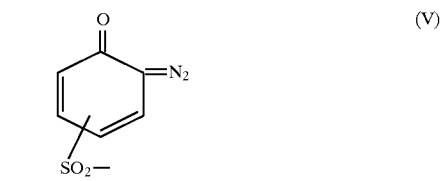

12. The water-less lithographic negative raw plate of claim 11, wherein the quinonediazide group in the reaction product obtained by esterifying the quinonediazide compound is at least one of the structures represented by the following formulae (VI) to (VIII):

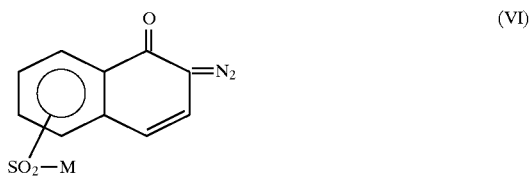

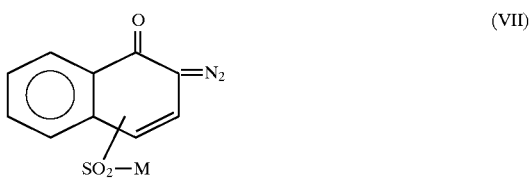

where M is selected from a group consisting of hydroxyl, alkali metal oxide, halogen, amino, mercapto, substituted or non-substituted alkyl, alkoxy, amido, acyloxy, alkanoyl, formyl, carboxyl groups having 1 to 100 carbons atoms, substituted or non-substituted alkenyl alkenyloxy groups having 2 to 100 carbon atoms, substituted or non-substituted aryl, and aryloxy groups having 4 to 100 carbon atoms.

13. The water-less lithographic negative raw plate of claim 1, wherein a binder polymer accounts for 10 to 90% of the photosensitive layer and the binder has a glass transition point(Tg) of 20° C. or lower.

14. The water-less lithographic negative raw plate of claim 1, wherein the photosensitive layer is a photo-releasable photosensitive layer.

15. The water-less lithographic negative raw plate of claim 1, wherein the ink repellent later has a surface covered with a protective film having a plain or a rough surface.

16. The water-less lithographic negative raw plate of claim 1, wherein said initial modulus is 5–40 kg/mm$^2$.

17. The water-less lithographic negative raw plate of claim 4, wherein the reaction product comprises a reaction product between the quinonediazide compound and a reaction product between the compound of the general formula (I) and the compound of the general formula (II).

* * * * *

UNITED STATES PATENT AND TRADEMARK OFFICE
CERTIFICATE OF CORRECTION

PATENT NO. : 5,866,294
DATED : February 2, 1999
INVENTOR(S) : Oguni et al.

It is certified that error appears in the above-identified patent and that said Letters Patent is hereby corrected as shown below:

In Column 13, line 39, please change "5" to --R5--.

In Column 21, at line 49, please change "a" to --$\alpha$--.

In Column 25, at line 58, please change "applied onto a" to --isobutyl ketone--.

In Column 33, at line 55, please change "(if)" to --(II)--.

Signed and Sealed this

Twenty-seventh Day of July, 1999

Attest:

Q. TODD DICKINSON

*Attesting Officer*      *Acting Commissioner of Patents and Trademarks*